(12) United States Patent
Schulz et al.

(10) Patent No.: US 10,879,012 B2
(45) Date of Patent: Dec. 29, 2020

(54) OXIDE LAYERS AND METHODS OF MAKING THE SAME

(71) Applicant: Alliance for Sustainable Energy, LLC, Golden, CO (US)

(72) Inventors: Philip Schulz, Massy (FR); Joseph Jonathan Berry, Boulder, CO (US); Arrelaine Allen Dameron, Boulder, CO (US); Paul Francois Ndione, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 80 days.

(21) Appl. No.: 15/997,403

(22) Filed: Jun. 4, 2018

(65) Prior Publication Data

US 2018/0350528 A1     Dec. 6, 2018

Related U.S. Application Data

(60) Provisional application No. 62/514,040, filed on Jun. 2, 2017.

(51) Int. Cl.
| | |
|---|---|
| *H01G 9/20* | (2006.01) |
| *H01G 9/00* | (2006.01) |
| *H01L 51/42* | (2006.01) |
| *H01L 51/00* | (2006.01) |

(52) U.S. Cl.
CPC ......... *H01G 9/2018* (2013.01); *H01G 9/0036* (2013.01); *H01G 9/2009* (2013.01); *H01L 51/0001* (2013.01); *H01L 51/0077* (2013.01); *H01L 51/4226* (2013.01); *H01L 51/4253* (2013.01); *H01L 51/0009* (2013.01); *H01L 2251/303* (2013.01)

(58) Field of Classification Search
None
See application file for complete search history.

(56) References Cited

U.S. PATENT DOCUMENTS

| | | | | |
|---|---|---|---|---|
| 2015/0243444 | A1* | 8/2015 | Irwin | ............. C09D 11/36 |
| | | | | 136/261 |
| 2016/0141112 | A1 | 5/2016 | Aswani et al. | |
| 2017/0324053 | A1* | 11/2017 | Tabet | ............. H01L 51/4226 |

FOREIGN PATENT DOCUMENTS

| | | | | |
|---|---|---|---|---|
| JP | 2016 9737 A | | 1/2016 | |
| WO | WO-2013084029 A1 * | | 6/2013 | ........... H01G 9/2018 |
| WO | WO-2016079145 A1 * | | 5/2016 | ............ C08G 1/126 |

OTHER PUBLICATIONS

Indian Institute of Technology, Bombay, "Perovskite solar cell including inorganic oxide electron transport material deposited on perovskite absorber layer," Indian Publication No. IN04327MU2015A, published May 19, 2017 (Indian patent application No. IN2015MU04327, filed Nov. 16, 2015) 23 pages.

(Continued)

*Primary Examiner* — Daniel P Malley, Jr.
(74) *Attorney, Agent, or Firm* — Michael A. McIntyre

(57) ABSTRACT

The present application discloses devices that include a perovskite layer, a first layer that includes an oxide, and an interface layer, where the interface layer is positioned between the first layer and the perovskite layer, the interface layer is in physical contact with both the first layer and the perovskite layer, and the interface layer consists essentially of the oxide.

10 Claims, 33 Drawing Sheets

(56) References Cited

OTHER PUBLICATIONS

International Search Report from corresponding PCT/US18/35872, dated Sep. 12, 2018, 2 pages.

Written Opinion from corresponding PCT/US18/35872, dated Sep. 12, 2018, 4 pages.

Correa Baena et al., "Highly efficient planar perovskite solar cells through band alignment engineering," Energy & Environmental Science, 2015, vol. 8, pp. 2928-2293.

Deng et al., "Advances in the Application of Atomic Layer Deposition for Organometal Halide Perovskite Solar Cells," Advanced Materials Interfaces, vol. 3, 2016, 10 pages.

Hu et al., "Atomic Layer Deposition of $TiO_2$ for a High-Efficiency Hole-Blocking Layer in Hole-Conductor-Free Perovskite Solar Cells Processed in Ambient Air," Applied Materials & Interfaces, vol. 8, 2016, pp. 17999-18007.

Kot et al., "Room-Temperature Atomic Layer Deposition of $Al_2O_3$: Impact on Efficiency, Stability and Surface Properties in Perovskite Solar Cells," Chemsuschem Communications, vol. 9, 2016, pp. 3401-3406.

Mane et al., "Indium Oxide Thin Films by Atomic Layer Deposition Using Trimethylindium and Ozone," Journal of Physical Chemistry C, vol. 120, 2016, pp. 9874-9883.

McConnell et al., "Atomic layer deposition of $Al_2O_3$ for single electron transistors utilizing Pt oxidation and reduction," Journal Vacuum Science Technology A, vol. 34, No. 1, Jan./Feb. 2016, 5 pages.

Miller et al., "Substrate-controlled band positions in $CH_3NH_3PbI_3$ perovskite films," Phys Chem Chem Phys, 2014, vol. 16, pp. 22122-22130.

Selvaraj et al., "Effect of Using Ethanol as the Oxygen Source on the Growth and Dielectric Behavior of Atomic Layer Deposited Hafnium Oxide," ECS Transactions, vol. 61, No. 6, 2014, pp. 93-102.

Schulz et al., "Electronic Level Alignment in Inverted Organometal Perovskite Solar Cells," Advanced Materials Interfaces, 2015, vol. 2, 5 pages.

Wang et al., "Low-temperature plasma-enhanced atomic layer deposition of tin oxide electron selective layers for highly efficient planar perovskite solar cells," Royal Society of Chemistry, Journal of Materials Chemistry A, vol. 4, 2016, pp. 12080-12087.

Zardetto et al., "Atomic layer deposition for perovskite solar cells: research status, opportunities and challenges," Royal Society of Chemistry, Sustainable Energy & Fuels, vol. 1, 2017, pp. 30-55.

\* cited by examiner

OXIDE LAYERS AND METHODS OF MAKING THE SAME

CROSS-REFERENCE TO RELATED APPLICATIONS

This application claims the benefit of U.S. Provisional Application No. 62/514,040 filed Jun. 2, 2017, the contents of which are incorporated herein by reference in their entirety.

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

BACKGROUND

Solar cells based on hybrid organic-inorganic perovskite absorbers have reached outstanding performance over the past few years, surpassing power conversion efficiency of over 20%. These rapid technologic advances have developed into a driving force in the scientific community to understand the fundamental physical and chemical properties of this material class. There have been myriad device architectures demonstrated with varying efficiencies. In this context, basic properties such as the effective carrier concentration of the materials as well as the role of the substrate and processing in setting these critical device properties have remainded unclear. This results in a need for improved understanding of the underlying mechanisms with respect to device operation associated with the perovskite active layers (PALs) and its electronic coupling to adjacent charge transport materials (CTMs). In the specific case of halide perovskite solar cells (HPSCs) it is also clear that the interfaces are critical not only to device efficiency but also can dramatically impact the stability of HPSCs. The removal of the CTM layers in some device architecture reiterates the need for more basic insight of not only the interfacial electronic structure but also more detailed mechanistic understanding of how these functional are produced. Thus, there remains a need for advancing the basic understanding of PALs and how they interact with other compoenents in HPSCs, where such advancment may provide better performing HPSC designs, architectures, and methods for producing such devices.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

Disclosed herein are devices comprising a perovskite layer, a first layer comprising an oxide, and an interface layer.

In exemplary embodiments, the interface layer is positioned between the first layer and the perovskite layer, the interface layer is in physical contact with both the first layer and the perovskite layer, and the interface layer consists essentially of the oxide.

In some embodiments, the first layer may have a thickness between 1 nm and 50 nm, the first layer may be n-type, or may be free of oxy-halogen species.

In further embodiments, the devices may comprise a second layer comprising an oxide in physical contact with perovskite layer, and the perovskite layer may be positioned between the first layer and the second layer.

In certain embodiments, the second layer is n-type.

In some embodiemtns, the devices may comprise a substrate, and the second layer may be positioned between the perovskite layer and the substrate.

In exemplary devices, the perovskite comprises at least one methyl ammonium lead iodide or formamidinium lead iodide. In additional devices, the oxide comprises at least one of TiO2, NiO, ZnO, or MnO.

Also disclosed are methods for producing an oxy-halogen-free oxide layer on a perovskite layer using at least one atomic layer deposition or molecular layer deposition.

In addition to the exemplary aspects and embodiments described above, further aspects and embodiments will become apparent by reference to the drawings and by study of the following descriptions.

BRIEF DESCRIPTION OF THE DRAWINGS

Some embodiments of the present disclosure are illustrated in referenced figures of the drawings. It is intended that the embodiments and figures disclosed herein are to be considered illustrative rather than limiting.

REFERENCE NUMBERS

| | |
|---|---|
| 100 | perovskite |
| 110 | A-cation |
| 120 | B-cation |
| 130 | anion (X) |
| 200 | device |
| 210 | perovskite layer |
| 220 | first oxide layer |
| 230 | substrate |
| 300 | second oxide layer |
| 310 | interface layer |

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

The present disclosure relates to devices that include perovskite films containing charge transport layers having unique physical and performance properties. The present disclosure also relates to methods for making such devices.

Figure 1:
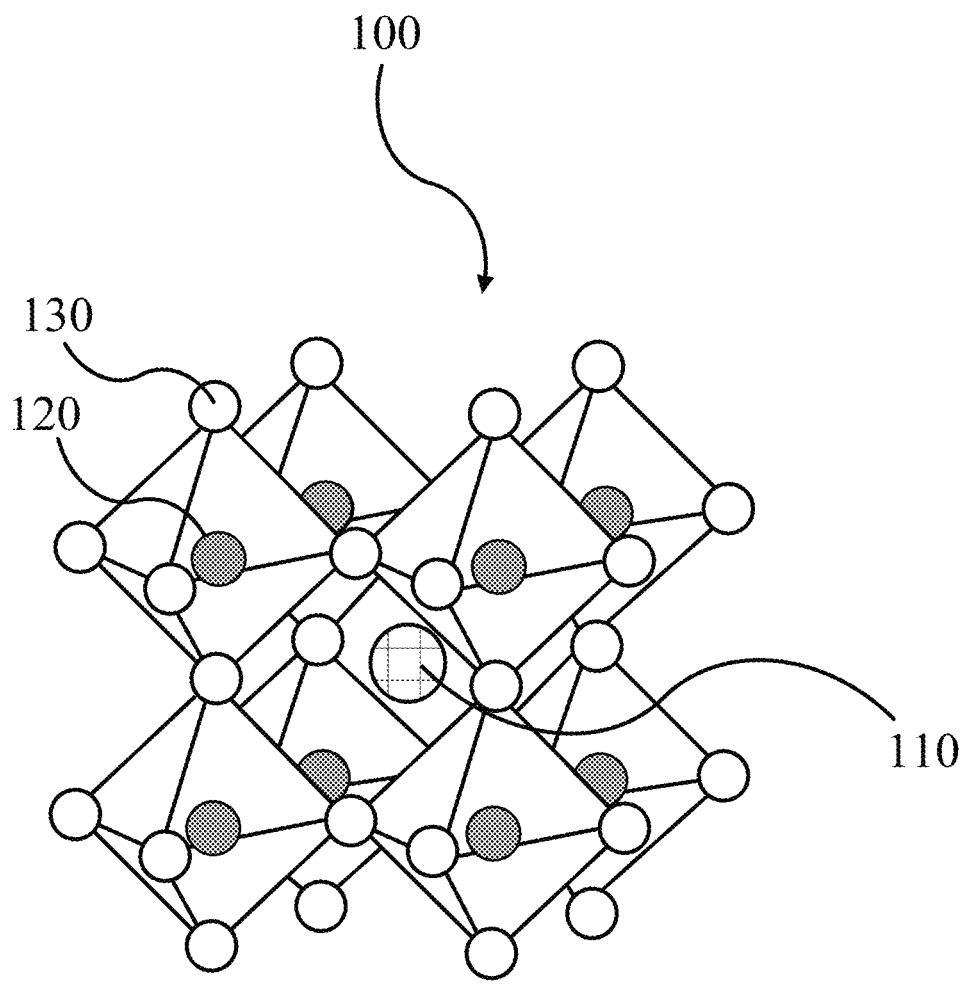
FIG. 1 illustrates a schematic of a perovskite material, according to some embodiments of the present disclosure.

FIG. 1 illustrates that a perovskite may organize into cubic crystalline structures and may be described by the general formula ABX3, where X (130) is an anion and A (110) and B (120) are cations, typically of different sizes with the A-cation 110 typically larger than the B-cation 120. In a cubic unit cell, the B-cation 120 resides at the eight corners of a cube, while the A-cation 110 is located at the center of the cube and with 12 X-anions 130 centrally located between B-cations 120 along each edge of the unit cell. Typical inorganic perovskites include calcium titanium oxide (calcium titanate) minerals such as, for example, CaTiO$_3$ and SrTiO$_3$. In some embodiments of the present invention, the A-cation 110 may include a nitrogen-containing organic compound such as an alkyl ammonium compound. The B-cation 120 may include a metal and the anion 130 may include a halogen.

Additional examples for an A-cation A 110 include organic cations and/or inorganic cations. A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH^{3+}$), ethylammonium ($CH_3CH_2NH^{3+}$), propylammonium ($CH_3CH_2 CH_2NH^{3+}$), butylammonium ($CH_3CH_2 CH_2 CH_2NH^{3+}$), formamidinium ($NH_2CH=NH^{2+}$), and/or any other suitable nitrogen-containing organic compound. In other examples, an A-cation 110 may include an alkylamine. Thus, an A-cation 110 may include an organic component with one or more amine groups. For example, an A-cation 110 may be an alkyl diamine halide such as formamidinium $(CH(NH_2)_2)^+$.

Examples of metal B-cations 120 include, for example, lead, tin, germanium, and or any other 2+ valence state metal that can charge-balance the perovskite 100. Examples for the anion 130 include halogens: e.g. fluorine, chlorine, bromine, iodine and/or astatine. In some cases, a perovskite 100 may include more than one anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and the X-anion 130 may be selected within the general formula of ABX3 to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in none integer quantities; e.g. x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure.

As stated above, the A-cation 110 may include an organic constituent in combination with a nitrogen constituent. In some cases, the organic constituent may be an alkyl group such as straight—chain and/or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Figure 2:
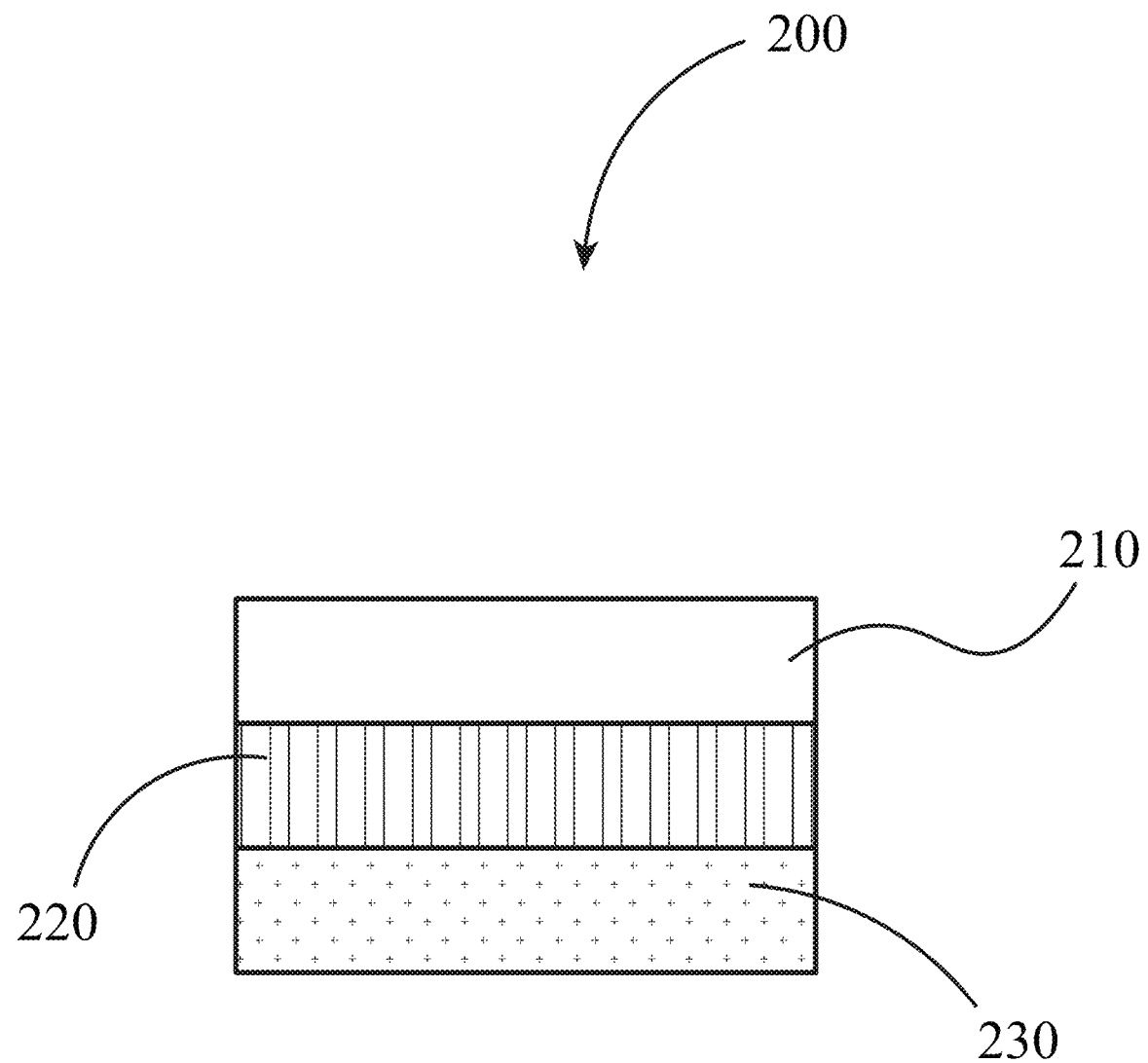
FIG. 2 illustrates a device that includes a perovskite layer in contact with a first oxide layer, according to some embodiments of the present disclosure.

FIG. 2 illustrates a device 200 that includes a perovskite layer 210 positioned on a first oxide layer 220, where the first oxide layer 220 is positioned between the perovskite layer 210 and a substrate 230. The perovskite layer 210 may be constructed of a perovskite as described above and illustrated in FIG. 1. Perovskite layers (e.g. films) may have a thickness of a few nm thick to a few microns thick (e.g., from about 100 nm to about 2 microns thick). For the case of iodine-containing perovskite layers, the crystallize in the orthorombic perovskite phase and exhibit a wide range of band gaps from 1.3 eV to 1.9 eV. The first oxide layer 220 may be constructed of any suitable transparent conductive oxide (TCO) layer combination. For example, a first oxide layer 220 may be a sputter-deposited fluorine-doped tin oxide (FTO) layers of a few μm thickness with a thin (e.g., 10s of nm such as 10-200 nm) overcoat of $TiO_2$ (not shown; the $TiO_2$ may be pyrolytic) or other oxide. FTO layers can be replaced by other TCOs (e.g., indium-doped tin oxide ITO, indium-doped zinc oxide IZO, indium/gallium-doped zinc oxide) without changing the results presented here. Thus, a first oxide layer 220 may include at least one of an FTO layer and/or any other suitable TCO layer. The $TiO_2$ layer (not shown) can also be substituted by other oxide layers such as NiO from various (high temperature) processes up to the limit of the underlying TCO layer and substrate preserving mechanical stability and optical transparency as well as conductivity in case of the TCO film. In some embodiments of the present disclosure, a substrate 230 may be constructed of any suitable material including glass and/or plastics of various thicknesses as suited for the respective application, i.e. security glass of several mm thickness ultra-thin (μm) flexible substrates including but not limited flex glass, PET, PEN, etc. Lateral substrate 230 dimensions may be extended to large scale fabrication limited by a uniform oxide layer deposition method.

Figure 3:
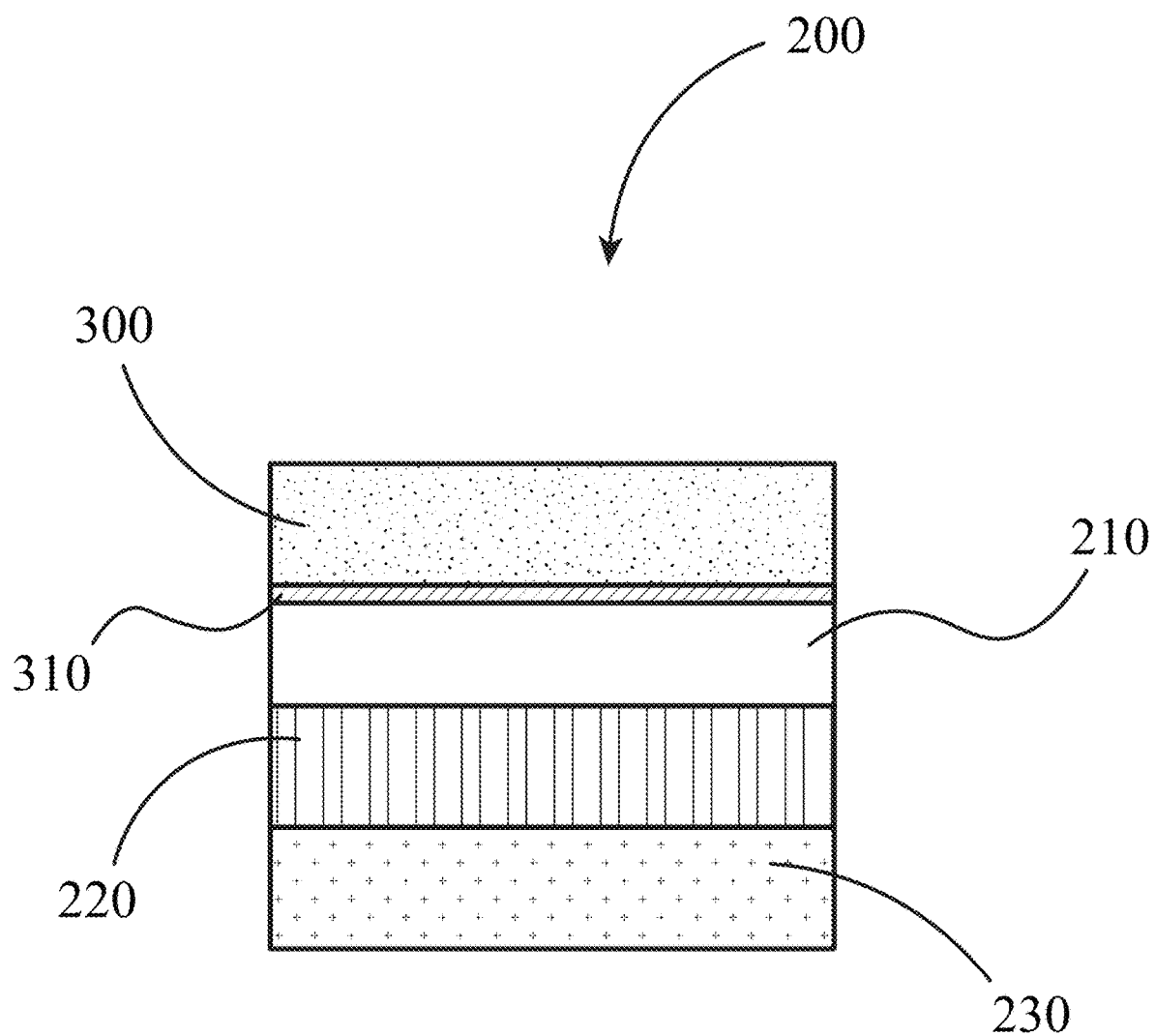
FIG. 3 illustrates a device that includes a perovskite layer in contact with a first oxide layer and a second oxide layer, according to some embodiments of the present disclosure.

FIG. 3 illustrates an embodiment of the present disclosure, a device 200 after a second oxide layer 300 has been applied to the perovskite layer 210, where the application of the second oxide layer 300 results in the creation of an interface layer 310 positioned between the second oxide layer 300 and the perovskite layer 210. This interface layer 310 is in physical contact with the perovskite layer 210 and the second oxide layer 300 and contains essentially only the oxide used to construct the second oxide layer 300. The second oxide layer 300 may be constructed of any suitable oxide, for example, transition metal oxides such as TiO, NiO, AlO, ZnO, and/or MnO. At least one of SnO and/or SrO can also be used to construct a second oxide layer 300 and interface layer 310. The second oxide layer 300 may be substantially free of halogen-containing species, for example oxy-iodo species which would also apply for oxy-bromo and oxy-chloro species. Thus, the interface layer 310 may be substantially free of halogen-containing species, for example oxy-iodo species.

In some embodiments of the present disclosure, both the first oxide layer 220 and the second oxide layer 300 may be n-type, meaning that electrons are the majority carriers for charge transport. As described herein, such oxide layers in contact with a perovskite layer, where the oxide layers do not contain halogen-containing species, may be produced using atomic layer deposition (ALD) methods.

Figure 4A:
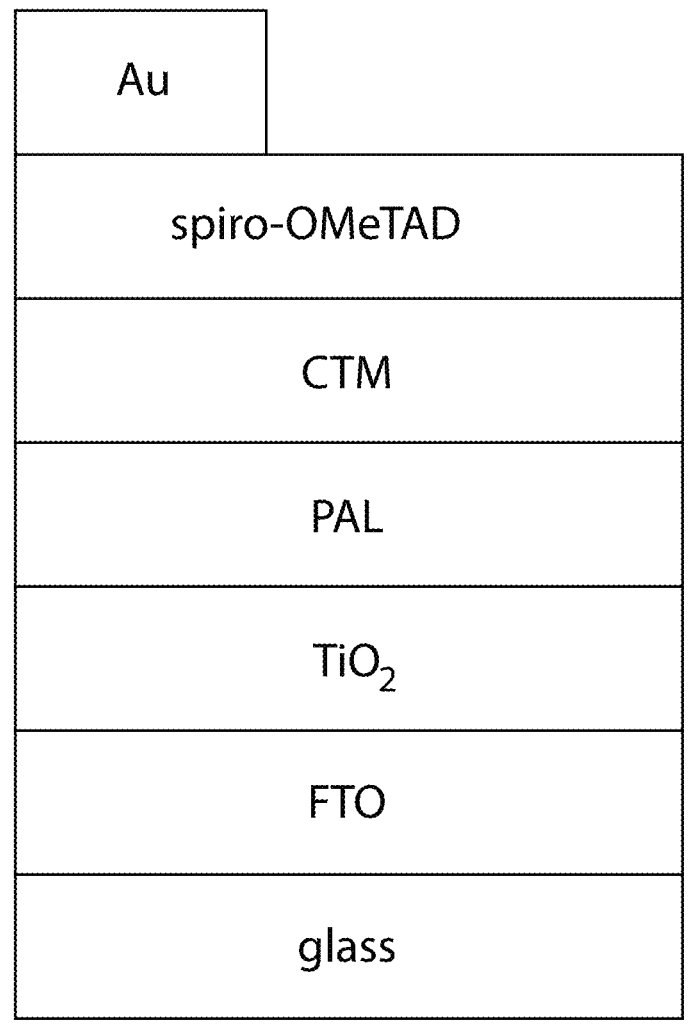
FIG. 4A illustrates a device geometry for HPSC using various thin CTM interlayers between active layer and hole transport layer, according to some embodiments of the present disclosure.

The present disclosure relates to nominally symmetric device architectures that maintain the performance of a PAL. As described herein, to understand and demonstrate the critical mechanism driving the performance of the interface between the charge transport layer of a device and its neighboring perovskite active layer, a range of tailor-made transition metal second oxide layers 300 positioned on top of hybrid perovskite layers 210 of technological relevance in HPSCs were studied. These respective second oxide layers, potentially behaving as CTMs, were studied in an alternative device geometry as depicted in FIG. 4A. By exploring $TiO_2$ and NiO, archetypical n-type and p-type semiconducting CTMs (respectively), as second oxide layers, the extent to which hole extraction from the perovskite layer correlates to the interfacial properties of the adjacent second oxide layer (indicated as CTM in FIG. 4A) was determined. While these studies prove that the interface between an HPSC's charge transport layer and perovskite layer is indeed critical for the device functionality, a contradiction was identified, regarding the charge selectivity of oxide layers behaving as CTM, relative to their behaviours as typically described in the literature, that being of limited relevance. Instead, the effectiveness of a CTM layer was determined to be closely linked with the deposition processing, which results in interfacial chemistry that subsequently modifies the interfacial electronics and final device performance. Breaking with the accepted paradigm of charge selectivity explains how the experiments described herein were able to realize a device with a thin n-type $TiO_2$ layer (a second oxide layer with a corresponding interface layer) between the perovskite layer 210 and the HTM layer, in this example spiro-OMeTAD, that shows equivalent performance parameters compared to a reference device and explains the performance of related device structures present in the literature. For the first time, these studies identify oxy-iodo defects formed at the PAL/CTM interface when the CTM is deposited under oxidative conditions. It is shown herein that these newly identified interfacial species strongly suppress charge carrier extraction. This identification has direct implications on the search, design, and deposition methods of charge extraction layers to enable improved device architectures and may extent to an understanding of degradation mechanics in hybrid perovskite based devices employing oxide CTMs. Taken in their totality, these findings highlight the unusual interfacial charge transfer from hybrid perovskites which requires a model reaching beyond the classic approximations of interfacial energy level alignment and charge selective contacts.

From the initial electronic structure investigations, it has been established that hybrid perovskite films can experience a substantial change of the Fermi level position in the gap depending on the conductive oxide substrate beneath. PAL on $TiO_2$ and NiO can adopt n-type or p-type semiconductor characteristic, respectively. This effect has been demonstrated for $MAPbI_3$ layers but this trend appears to be universally true for not only $FAPbI_3$ layers investigated herein but for all $APbX_3$ hybrid perovskite materials evaluated, spanning the prototypical A={cesium, methylammonium, formamidinium}, X={I, Cl, Br} systems and their alloys (see FIGS. 5A and 5B). These results motivate questions regarding the use of oxides more generally and what the associated electronics at the interface between the perovskite layer and an oxide layer for devices in which oxide layer contacts (e.g. first oxide layer 220 and second oxide layer 300) are used on both sides of the device stack. In the typical n-i-p architecture, the oxide substrate/PAL interface is not readily accessible for electronic characterization by standard surface sensitive techniques such as photoemission spectroscopy where the information depth does not exceed 10 nm in standard laboratory based systems. Here, the process of depositing thin CTM layers (second oxide layers) on top of a standard $FAPbI_3$ PAL opens up a unique opportunity to examine the electronic structure of these interfaces in a systematic fashion as well as potentially glean insight on the formation of the interface layer between perovskite active layers and charge transporting oxide layers, for example hybrid perovskite/transition metal oxide interfaces.

Figure 5A:
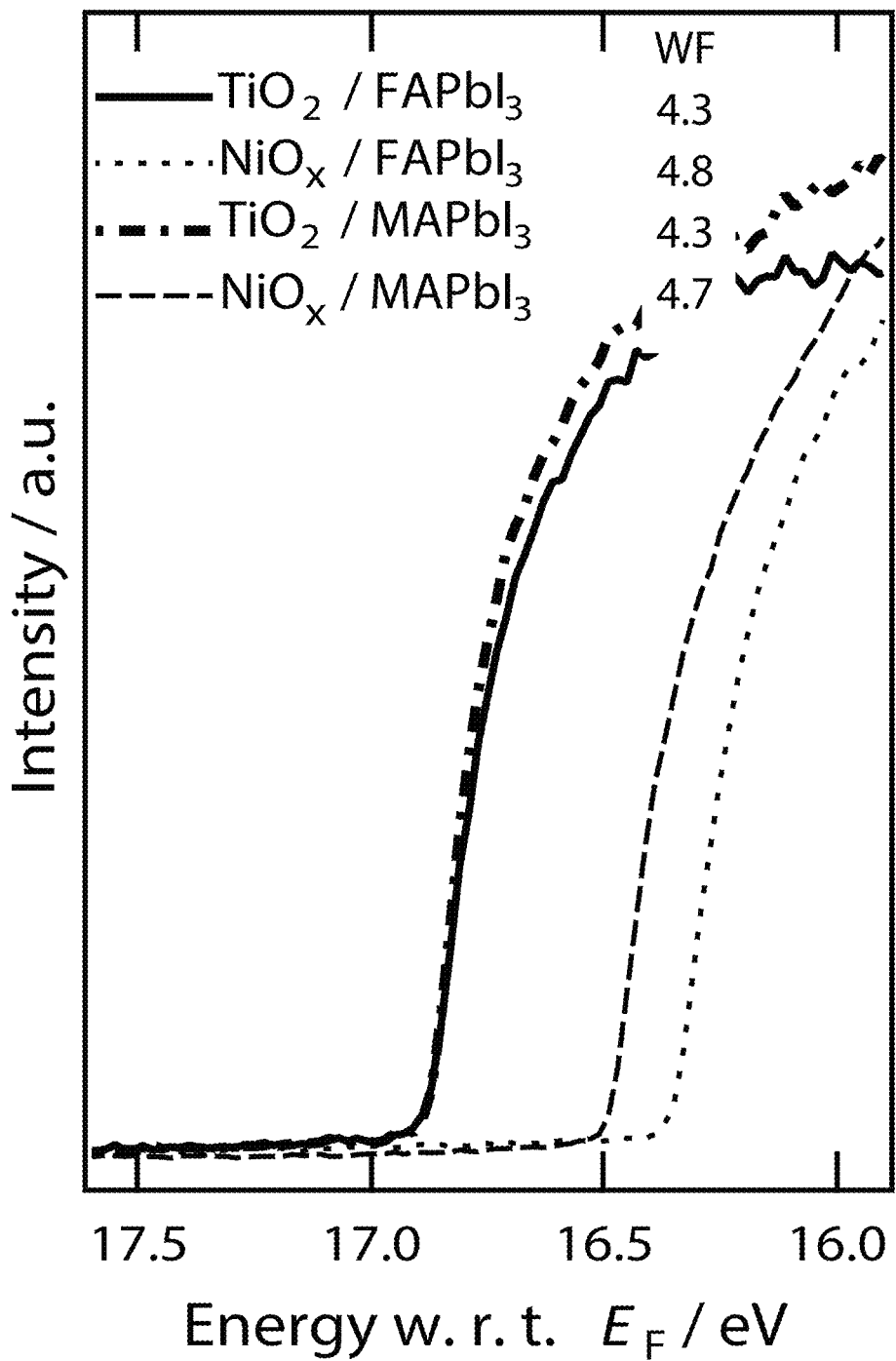
FIGS. 5A and 5B illustrate UPS spectra of $MAPbI_3$/$FAPbI_3$ on c-$TiO_2$/sNiO, according to some embodiments of the present disclosure.
Figure 5B:
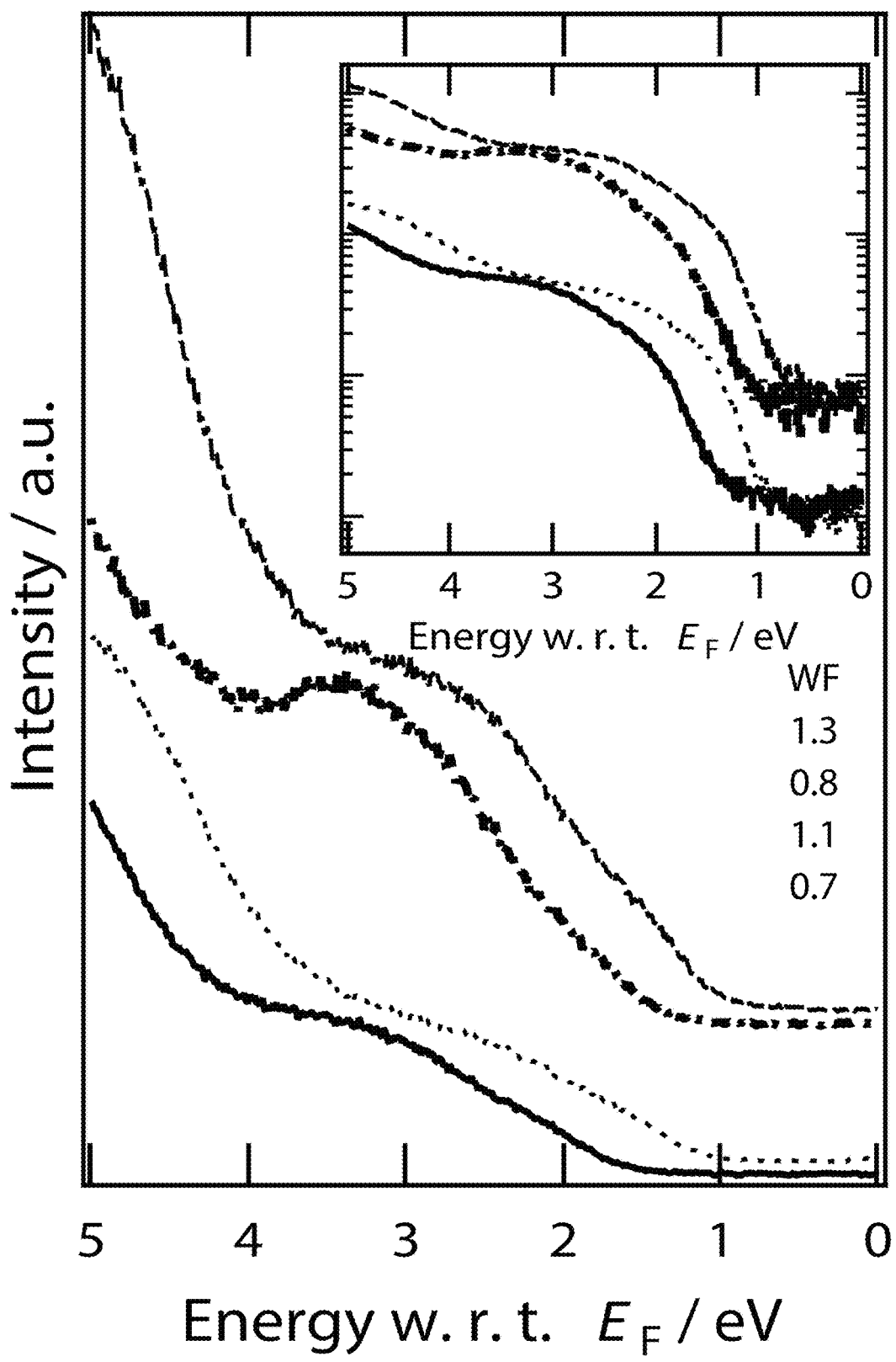

Referring to FIGS. 5A and 5B, formamidinium lead iodide ($FAPbI_3$) and methylammonium lead iodide ($MAPbI_3$) containing perovskite layers were tested. For second oxide layers 300, the architypical oxides, $TiO_2$ and NiO, used in HPSCS as well as a number of other oxides were deposited as thin films by pulsed laser deposition (PLD) onto the corresponding perovskite layers. PLD is one of the preferred methods of producing high quality oxide materials and is particularly suitable here, as precise control over the film thickness can be achieved as well as control over the oxide electronic properties. In addition, it is also possible to modulate the thermal load and presence of high-energy ions at the sample surface via the deposition atmosphere. Atomic layer deposition (ALD) was also utilized as an alternative approach commonly used for depositing thin film oxides including $TiO_2$ onto perovskite layers, which provides excellent uniform coverage of the underlying perovskite layer while at the same time allowing precise control over the thickness of the deposited oxide layer. For example, thin-films (e.g., 2-50 nm) of $TiO_2$ can be realized by reacting $TiCl_4$ with $H_2O$ to form $TiO_2$ layers. Film deposition by ALD can also be performed at temperatures below 100° C. to avoid thermally induced damage of the hybrid perovskite layer.

Figure 4B:
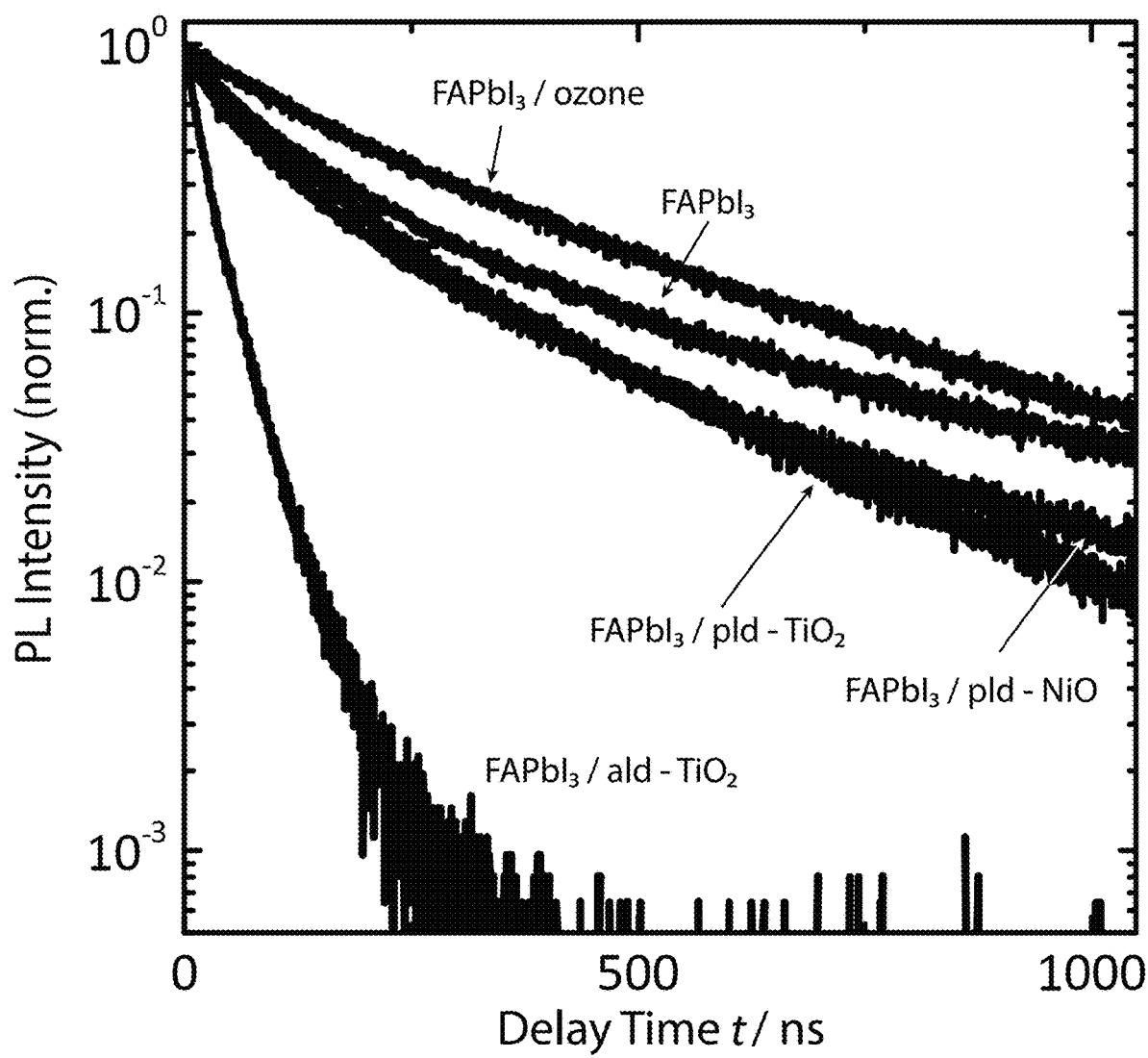
FIG. 4B illustrates tr-PL decay transients for $FAPbI_3$ films on glass with and without CTM layer/ozone treatment on the perovskite surface, according to some embodiments of the present disclosure.

The extent charge carrier dynamics are influenced by either oxide deposition method was investigated first. The influence of the oxide layers examined here and their impact on charge transfer across the interface layer between the perovskite layer and hole transport material (spiro-OMeTAD) was evaluated by the change in decay time of the photoluminescence emission originating from the $FAPbI_3$ layer as a function of transition metal oxide layers (second oxide layers) and surface treatment as depicted in FIG. 4B. Initially, the PL decay time for the plain (no oxide on top) $FAPbI_3$ perovskite layer on a glass substrate was rather large (t=140 ns). When 1 nm of NiO (second oxide layer) was deposited on top of the perovskite layer by PLD (PLD-NiO), between the perovskite layer and the hole transport material (spiro-OMeTAD), some amount of quenching was observed (t=100 ns). When a $TiO_2$ layer (second oxide layer 300) was deposited on the perovskite layer by PLD (PLD-$TiO_2$), between the perovskite layer and the hole transport material, the quenching was similar at 1 nm coverage (t=120 ns). A much more distinct effect on the PL emission was observed for the case of an ALD-deposite $TiO_2$ second oxide layers deposited on top of $FAPbI_3$ perovskite layer, between the perovskite layer and the hole transport layer. For a 1 nm thick layer of ALD-$TiO_2$ on top of $FAPbI_3$ perovskite layer, the PL decay time was reduced to 50 ns. These results suggest that the change in the PL quenching and the resulting performance of the CTM in the device may be dominated by some aspect of the second oxide layer and/or the deposition of the second oxide layer onto the perovskite layer. This hypothesis was verified by the use of a uv-ozone treatment, which also created significant quenching (t=250 ns) of the PL.

Figure 4C:
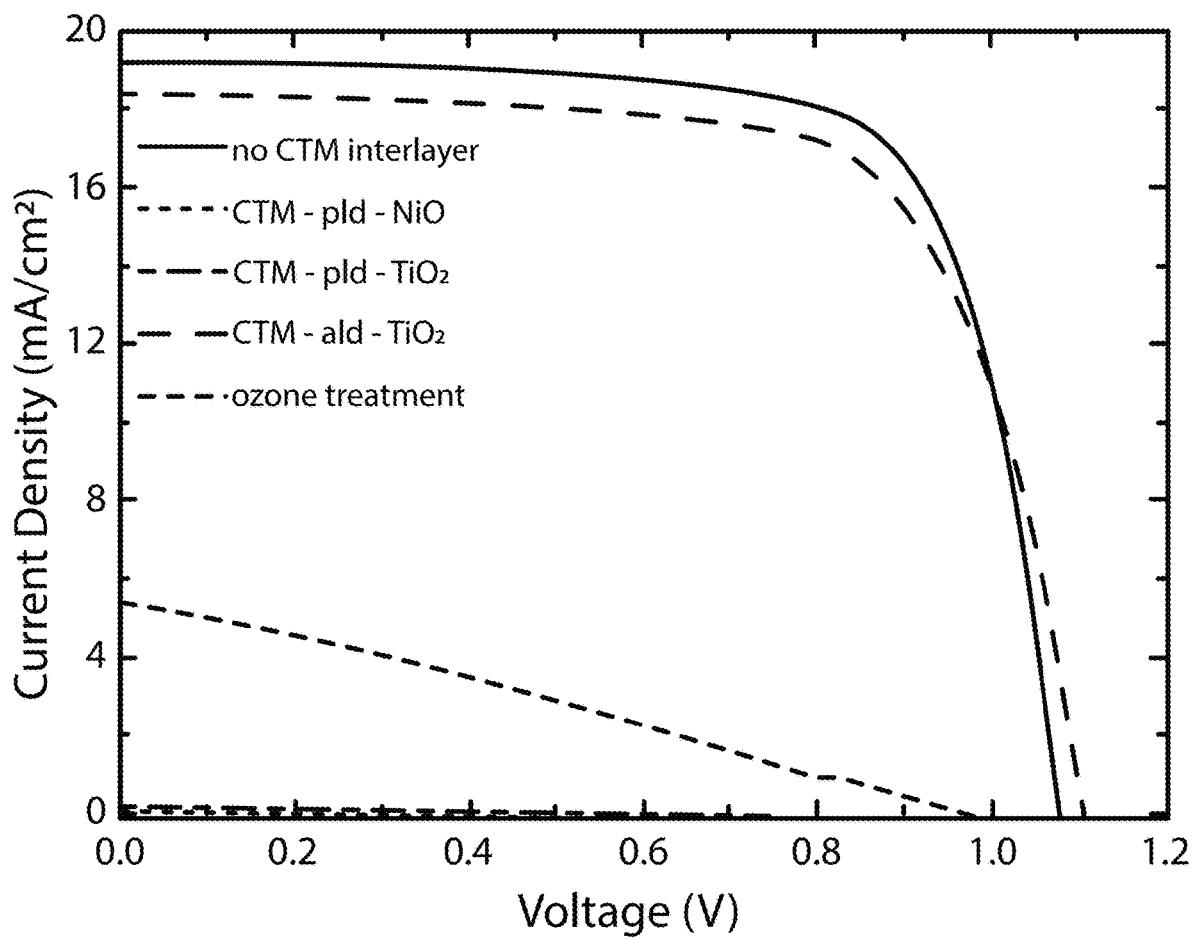
FIG. 4C illustrates device characteristics for $MAPbI_3$ based HPSCs with and without CTM interlayer and ozone treatment, according to some embodiments of the present disclosure.

In order to more directly evaluate the impact of electronics of the interface between a perovskite active layer and a charge transport layer (e.g. spiro-OMeTAD), the effects of thin transition metal oxide layers (second oxide layers 300) and the associated processing conditions used to build $FAPbI_3$ based photovoltaic cells on the resultant performance characteristics were evaluated (see FIG. 4C). Consistent with the hypothesis that oxygen deposition processes with reactive oxygen species can destroy the ability of carriers (e.g. holes and/or electrons) to traverse the interface between a carrier transport layer (e.g. an oxide layer and/or an organic material such as spiro-OMeTAD) and its neighboring perovskite layer, it was determined that the devices in which the perovskite layers had been subjected to either ozone treatment or prepared with a PLD processed CTM, exhibited a dramatic decrease in cell performance. The power conversion efficiency dropped from 15.1% in case of the control device without any second oxide layer (and resultant interface layer) between the perovskite layer and the organic hole transport layer (spiro-OMeTAD) down to 1.5% for a device in which the $FAPbI_3$ perovskite layer had been ozone treated before the application of the organic hole transport material. For the example of a PLD-deposited NiO second oxide layer and a PLD-deposited $TiO_2$ second oxide layer positioned between the perovskite layers and the organic HTL (spiro-OMeTAD), the reductions to device efficiencies where relatively insignificant at less than 0.1%, regardless of the type of metal oxide used to form the second oxide layer (e.g. NiO or $TiO_2$).

Figure 6:
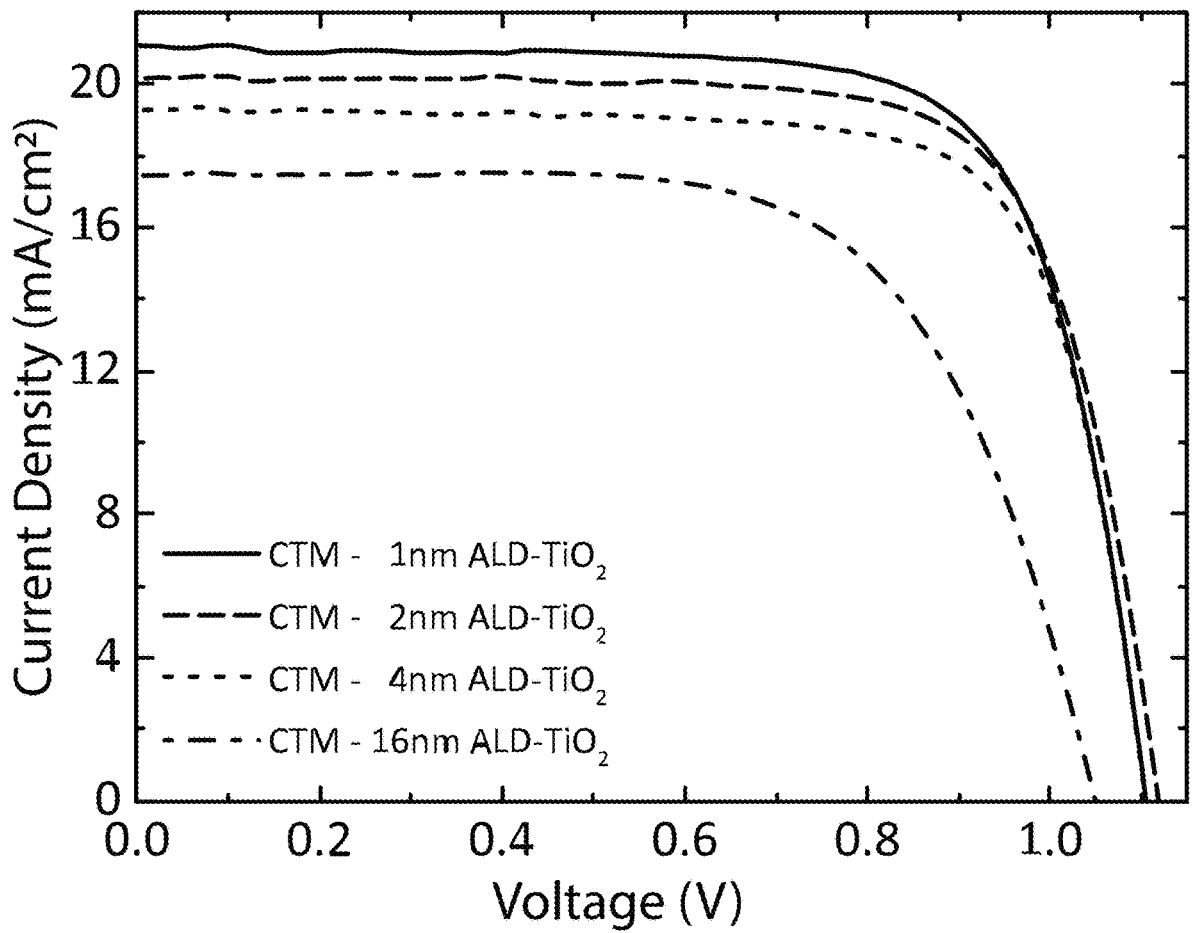
FIG. 6 illustrates the device characteristics for $MAPbI_3$ based HPSCs with ALD-$TiO_2$ interlayers of various thicknesses, according to some embodiments of the present disclosure.

Additionally, to exclude simple tunneling through devices having relatively thin second oxide layers, devices with thicker ALD-$TiO_2$ layers between their respective perovskite layers and HTM layers were produced. Second oxide layers constructed of $TiO_2$ and having thicknesses of 2 nm, 4 nm, and 16 nm yielded power conversion efficiencies of 16.7%, 16.0% and 12%, respectively (see FIG. 6). This indicates that the device performance decreased to some extent, yet the expected catastrophic device failure for sandwiching a perovskite active layer between two hole blocking layers did not occur.

In contrast to this, devices employing a thin layer of ALD-deposited $TiO_2$ second oxide layers on top of perovskite layers led to surprising results. Despite titanium dioxides's hole blocking tendancies and its normal function as an electron injection layer, the very thin (1 nm) ALD-$TiO_2$ layer (second oxide layer) presented only a small perturbation to the photovoltaic operation of the resultant device, which suprisingly exhibited a power conversion efficiency of 14.1%. A comparison of this finding to the performance of the device with the PLD-deposited $TiO_2$ second oxide layer, reveals that the effect of adding thin second oxide layers, and their resultant interface layers, which can act as hole blockers, was negligible compared to the effects of exposure of the perovskite layers to reactive oxygen species during the deposition process, which led to very significant reductions in device performances. This clearly indicates the importance of the interfacial chemistry and defect structure on the efficiency of charge collection within a HPSC device stack, especially the interfacial composition and chemistry a the interface between perovskite active layers and their neighboring charge transport layers. In the case of the glass/FTO/$TiO_2$/$FAPbI_3$/ALD-$TiO_2$/spiro-MeOTAD/Au cell stack, the device exhibited a largely symmetrical layout with the perovskite film sandwiched between two $TiO_2$ layers (a first oxide layer and a second oxide layer), both of which were n-type. As such, employing the thin ALD-deposited $TiO_2$ second oxide layer between a perovskite layer and a spiro-MeOTAD HTL is highly counterintuitive. Yet the positive result in terms of unimpeded power conversion efficiency indicates a significant deviation of the assumption that the interfaces require strict charge carrier selectivity. A more direct assessment of the interfacial electronic structure is thus required to identify the mechanism by which charge carrier extraction from the PAL has been so radically modified. Moreover, there is a clear need to consider not only the interface materials but the also the process methodology used for their integration with the other device stack components.

Figure 7A:
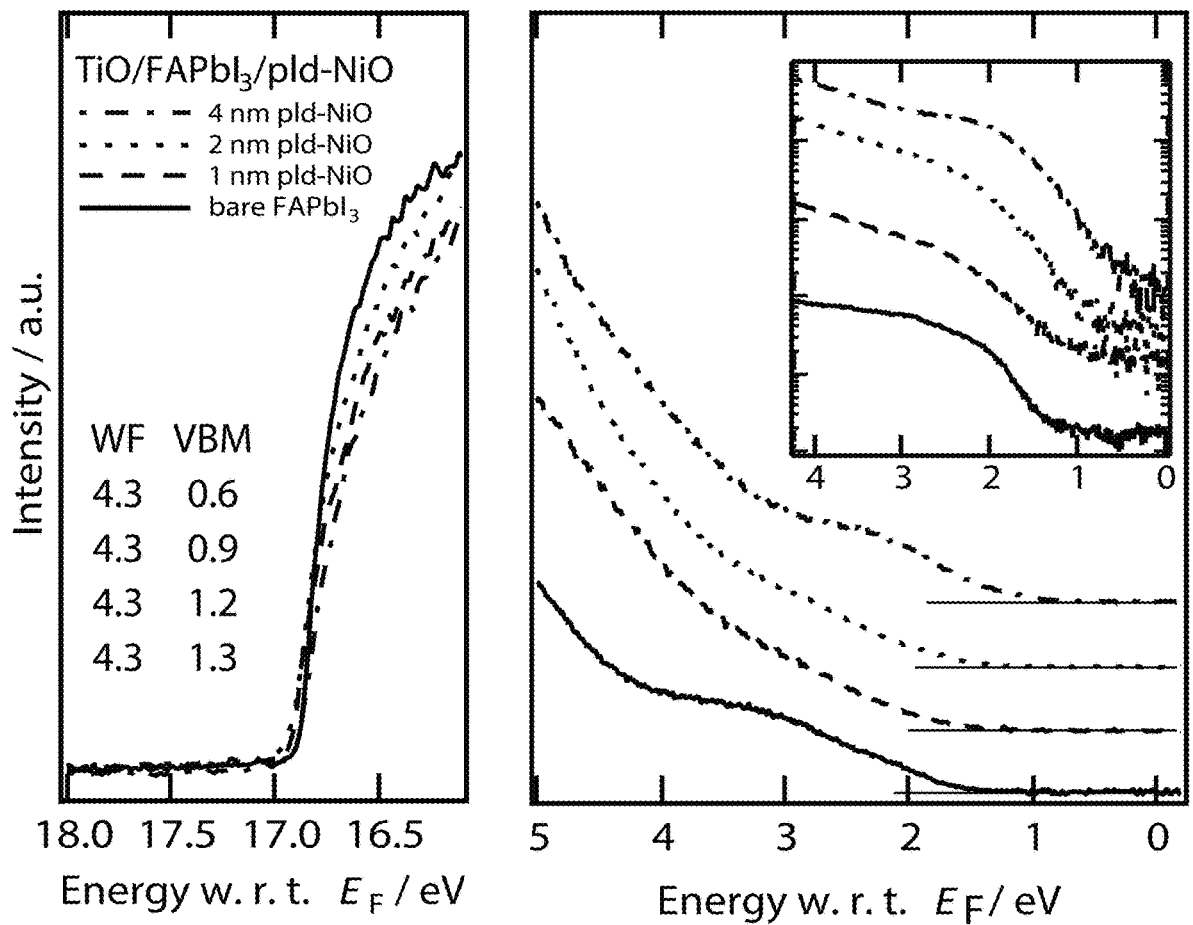
FIGS. 7A, 7B, and 7C illustrate UPS spectra of $FAPbI_3$ on $TiO_2$ with PLD-NiO, PLD-$TiO_2$ and ALD-$TiO_2$ layers on top divided into the regions of secondary electron cut-off and valence band with the inset in semi-logarithmic representation, according to some embodiments of the present disclosure.
Figure 7B:
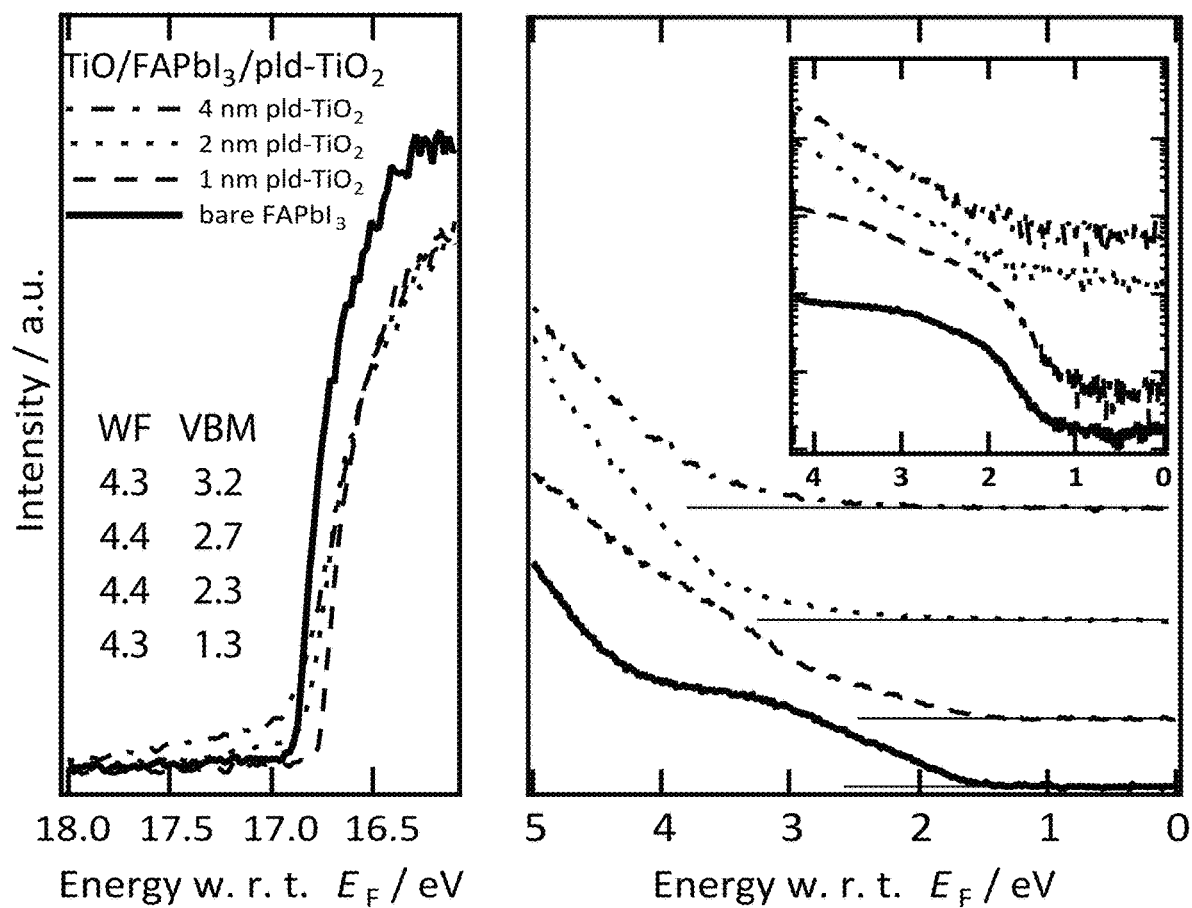
Figure 7C:
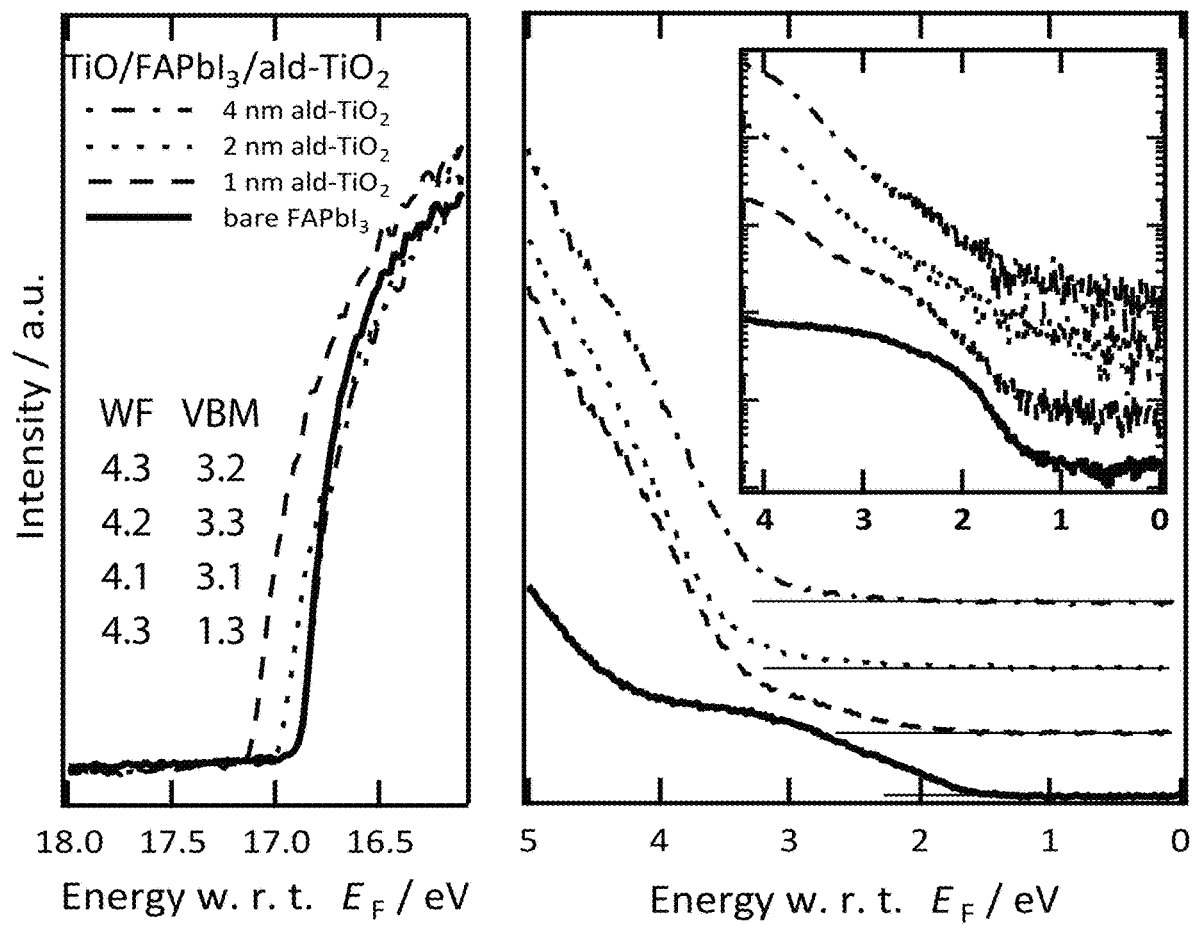

Using photoemission spectroscopy (UPS), a more detailed picture of the electronic and chemical changes at the interfaces between perovskite active layers and various second oxide layers, e.g. transition metal oxides layers, was assessed. The ultraviolet photoemission spectroscopy (UPS) spectra depicted in FIGS. 7A, 7B, and 7C summarize the evolution of the vacuum level position and the evolution of the valence band offset with respect to the Fermi level (EF) of a $FAPbI_3$ perovskite layer on a compact $TiO_2$ first oxide layer as a function of the thickness of a PLD-deposited NiO second oxide layer positioned on top of the perovskite layer; e.g. the perovskite layer was positioned between the first oxide layer and the second oxide layer. For the the example of a 1 nm thick PLD-deposited NiO second oxide layer, no profound change in the electronic structure was observed compared to a pristine $FAPbI_3$ perovskite layer. The work function remained at 4.3 eV for the $FAPbI_3$ perovskite layer and a PLD-deposite NiO second oxide layer having a thickness of 4 nm and positioned on top of the perovskite layer. Due to the soft nature of the electronic band edges in PAL materials, the determination of the top of the valence band can be ambiguous and usually requires a closer analysis of the semi-logarithmic representation of the valence band spectra (see inset of FIG. 7A). While the valence band maximum (VBM) of the n-type $FAPbI_3$ layer was located at roughly 1.3 eV below EF, the valence band onset for the 1 nm thick NiO second oxide layer is located at 1.2 eV below EF. Given a measured band gap of 3.2 eV, NiO second oxide layer appears to be p-doped, yet less p-type than NiO layers resulting from solution processing on conductive oxide substrates. However, from this initial interfacial alignment, the VBM of the NiO second oxide layer decreased with increasing second oxide layer thickness.

Figure 7D:
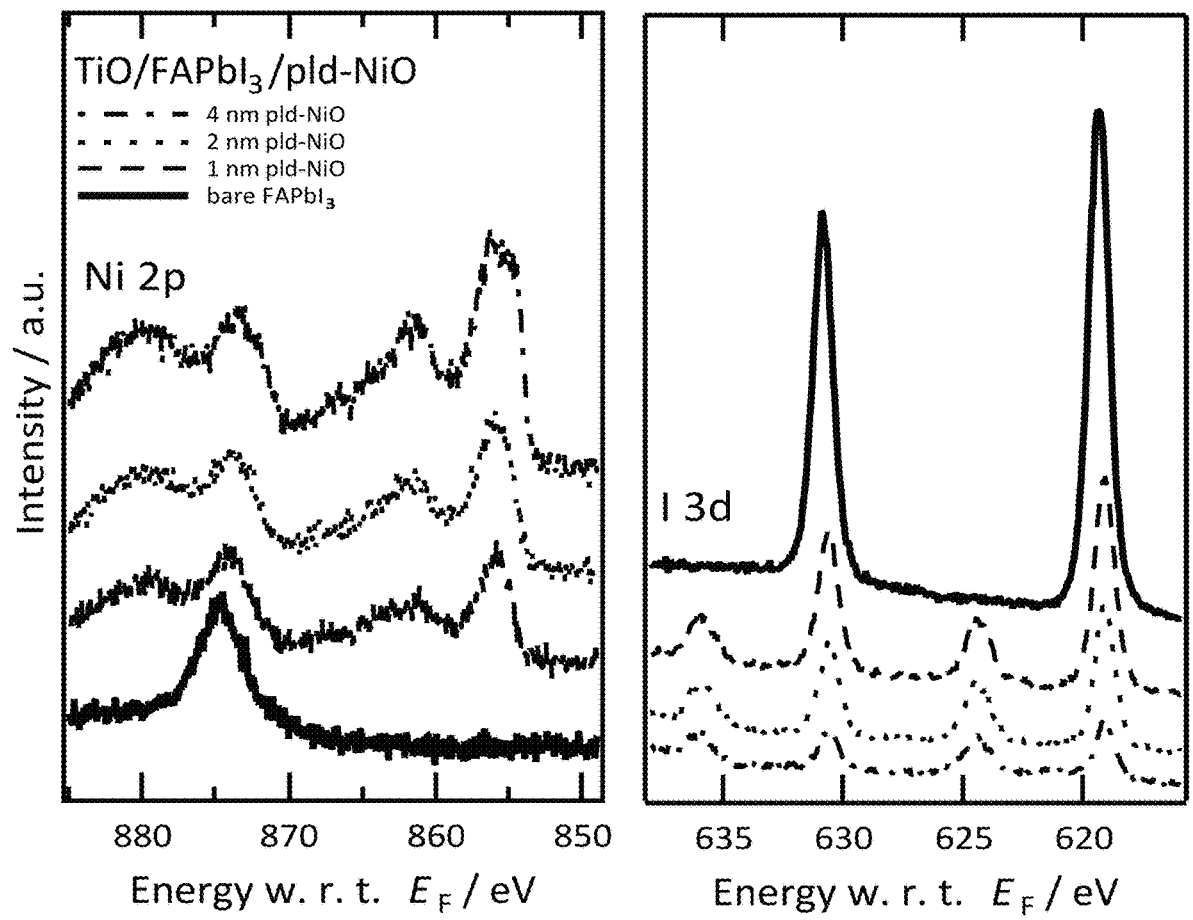
FIGS. 7D, 7E, and 7F illustrate XPS spectra of $FAPbI_3$ on $TiO_2$ with PLD-NiO, PLD-$TiO_2$ and ALD-$TiO_2$ layers on top, showing the oxide's metal 2p core level and the iodine 3d core level regions, according to some embodiments of the present disclosure.
Figure 8A:
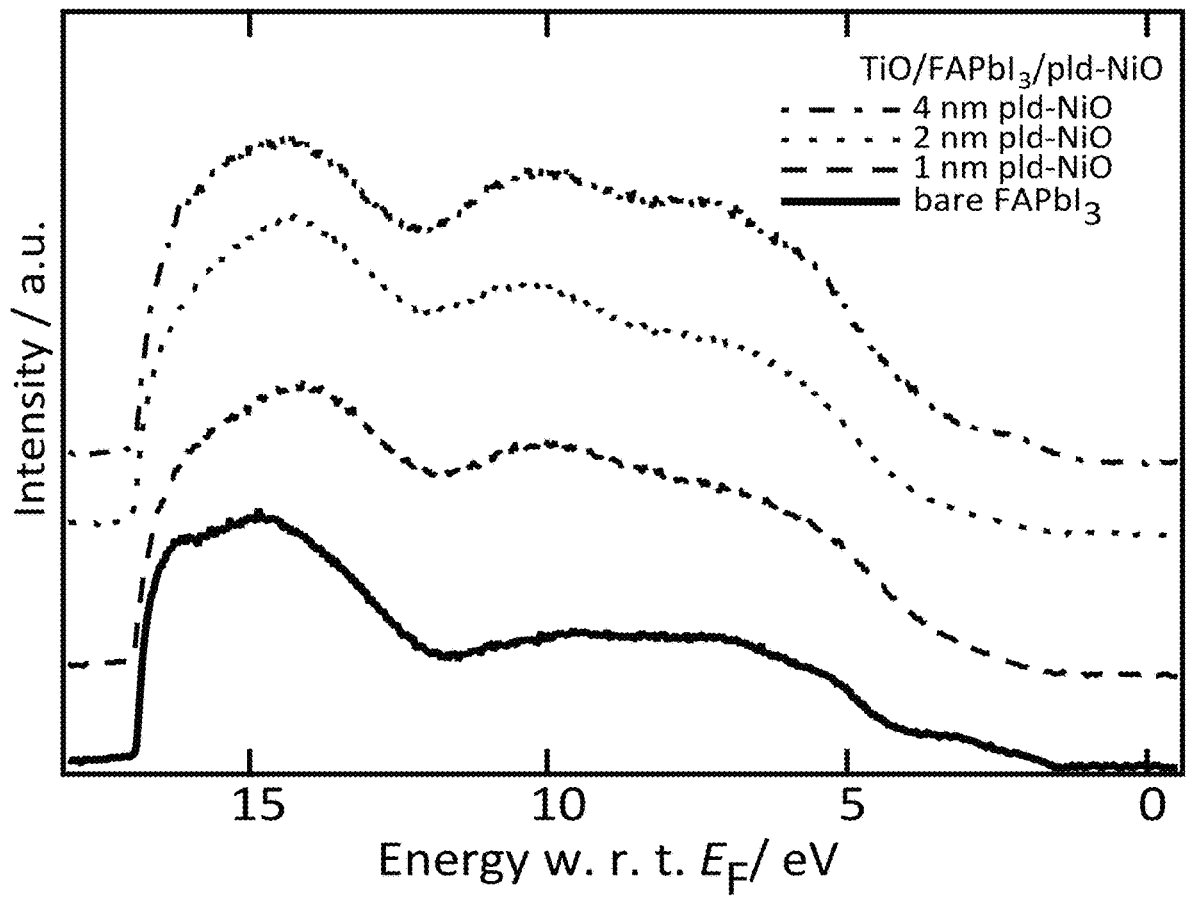
FIGS. 8A, 8B, and 8C illustrate XPS spectra of the O 1 s, N 1 s, C 1 s, Pb 4f core level regions of incrementally grown (FIG. 8A) PLD-NiO, (FIG. 8B) PLD-TiO$_2$ and (FIG. 8C) ALD-TiO$_2$ films on FAPbI$_3$, according to some embodiments of the present disclosure.

For a PLD-deposited NiO second oxide layer having a thickness of 4 nm, the VBM was measured at 0.6 eV with respect to EF yielding an ionization energy (IE) of 5 eV, with both satisfactorily matching analogously prepared p-doped PLD-deposited NiO second oxide layers positioned beside perovskite layers but deposited directly on tin doped indium oxide layers. These findings were further corroborated by the X-ray photoemission spectroscopy (XPS) spectra of the same layers (see FIG. 7D). The evolution of the Ni 2p signal intensity is in accordance with the nominally increasing thickness of the NiO second oxide layer. A subtle difference in shape is apparent between the spectra of the 1 nm, 2 nm, and 4 nm thick second oxide layers. Particularly in case of the 4 nm thick NiO second oxide layer, additional peak shoulders at 854 eV and 872 eV became apparent for the respective spin-orbit split Ni 2p components. Along these lines of the UPS valence band scans this additional core level component indicates that the functionally highly p-type NiO second oxide layer was formed further away from the interface between the perovskite active layer and the second oxide layer, with some intermediate, with a less p-type phase in the closer vicinity to the interface. This determination is further supported by the signature of the O 1s signal (see FIG. 8A) where the typical NiO related O 1s peak at 530 eV binding energy was only formed at increasing NiO coverage and did not become significant until a thickness of 4 nm NiO was achieved. In addition, XPS was used to track the evolution of the Fermi level position in the $FAPbI_3$ perovskite layer below the deposited CTM layer due to the chemical specificity of the iodine and lead core levels. There, however, the most striking feature was observed in the I 3d region (see FIG. 7D). Starting with the PLD-deposited NiO second oxide layer with a 1 nm thickness, two clear distinct doublets of the I 3d5/2 and I 3d3/2 core levels are located at binding energies of 619 eV and 633 eV as well as 625 eV and 640 eV, respectively. The first doublet at lower binding energies is representative of iodine in the halide organic lead perovskite composition. The doublet at higher binding energies has not been observed yet for hybrid perovskites but is identified to originate from oxy-iodo complexes. The O 1s level depicted in FIG. 8A supports the identification of oxy-iodo complexes seen for thin thicknesses (<4 nm).

Figure 7G:
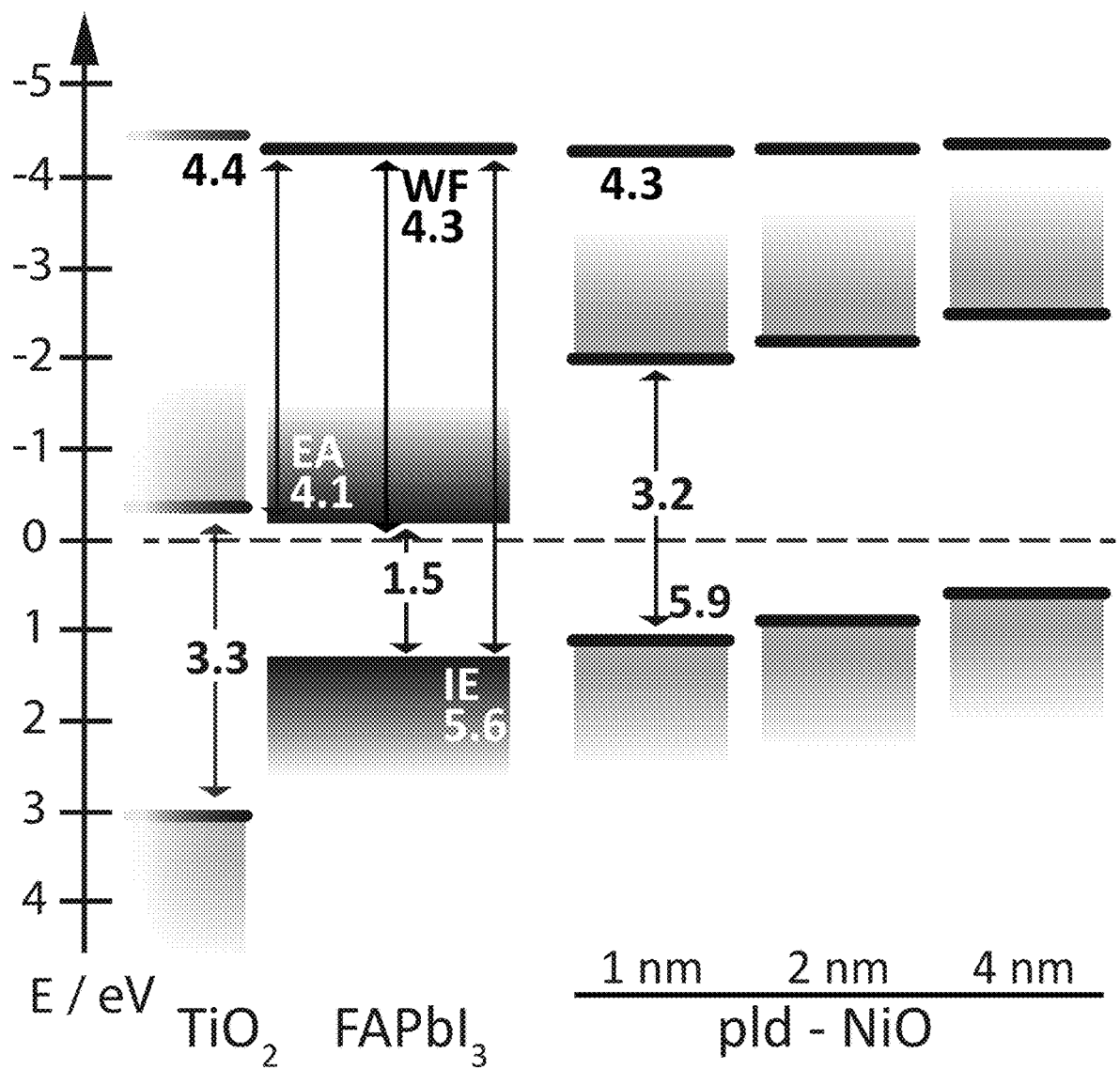
FIGS. 7G, 7H, and 7I illustrate band diagrams of FAPbI$_3$ on TiO$_2$ with PLD-NiO, PLD-TiO$_2$ and ALD-TiO$_2$ layers on top, according to some embodiments of the present disclosure.
Figure 8B:
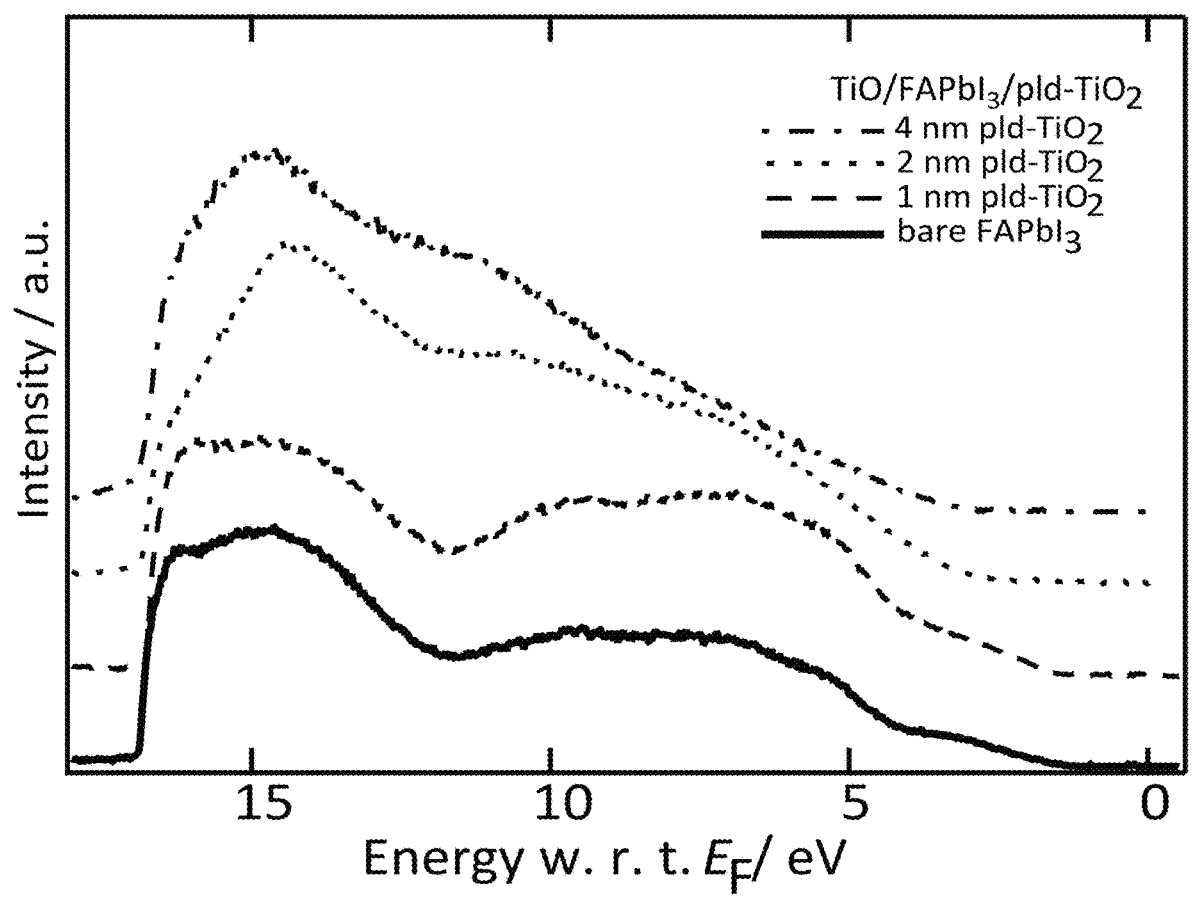
Figure 8C:
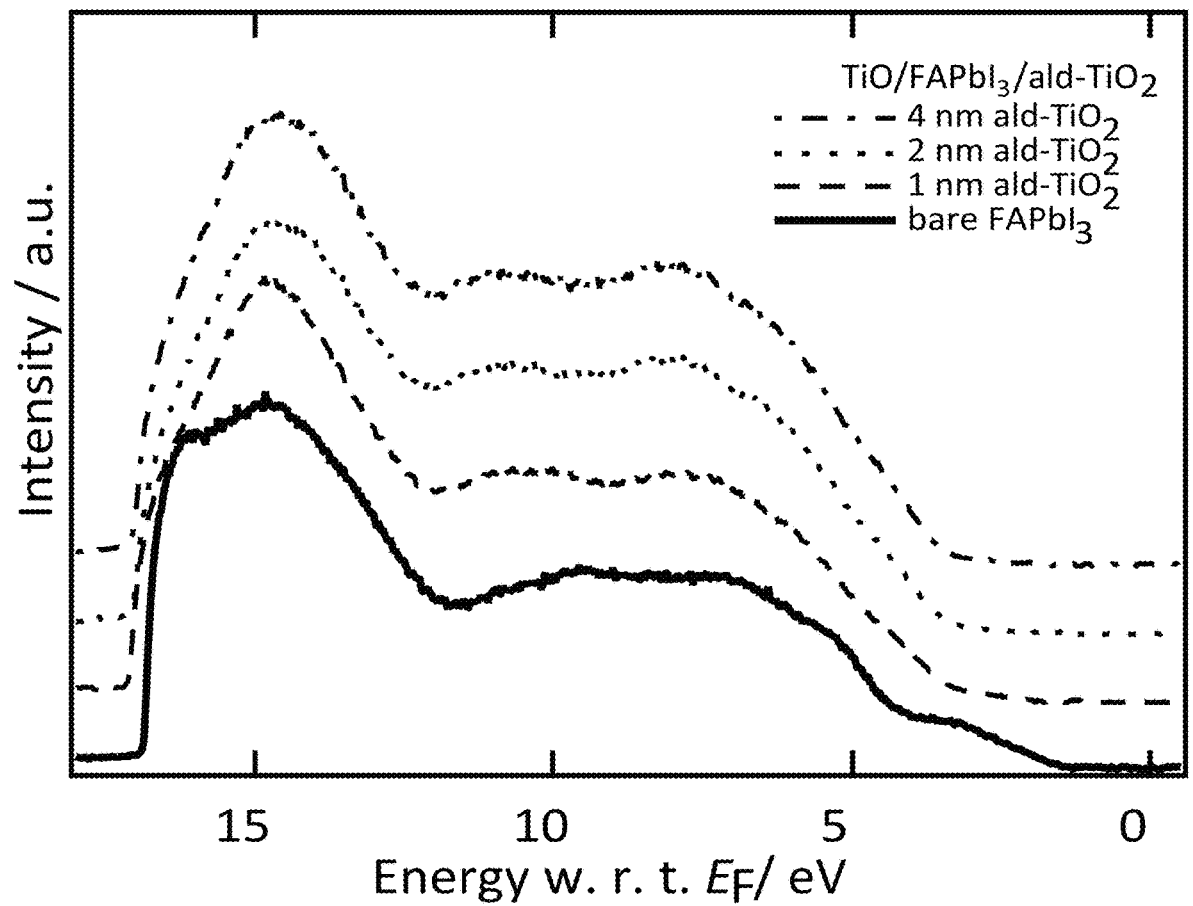
Figure 9:
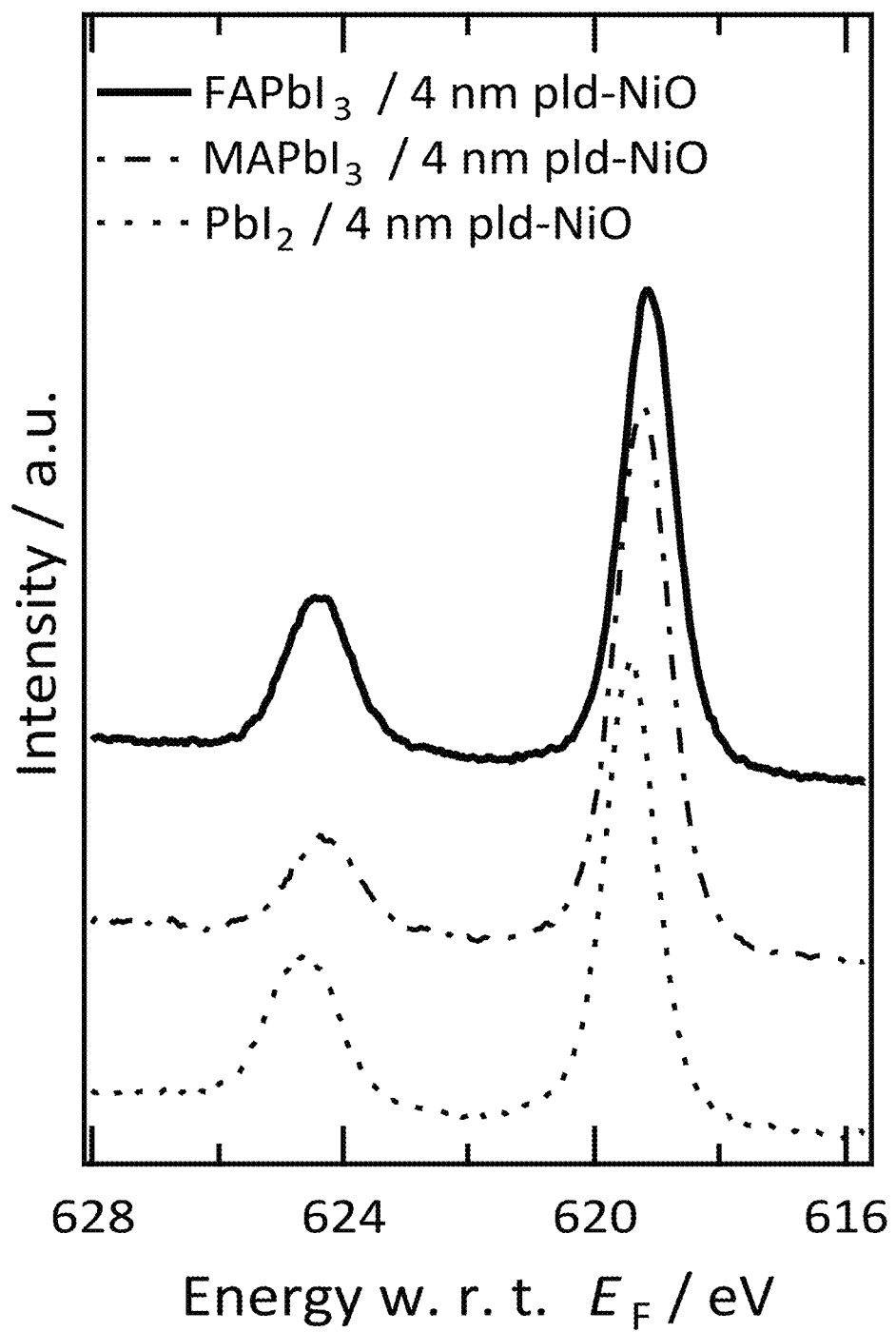
FIG. 9 illustrates UPS survey scans of oxide films on top of FAPbI$_3$, according to some embodiments of the present disclosure.
Figure 10A:
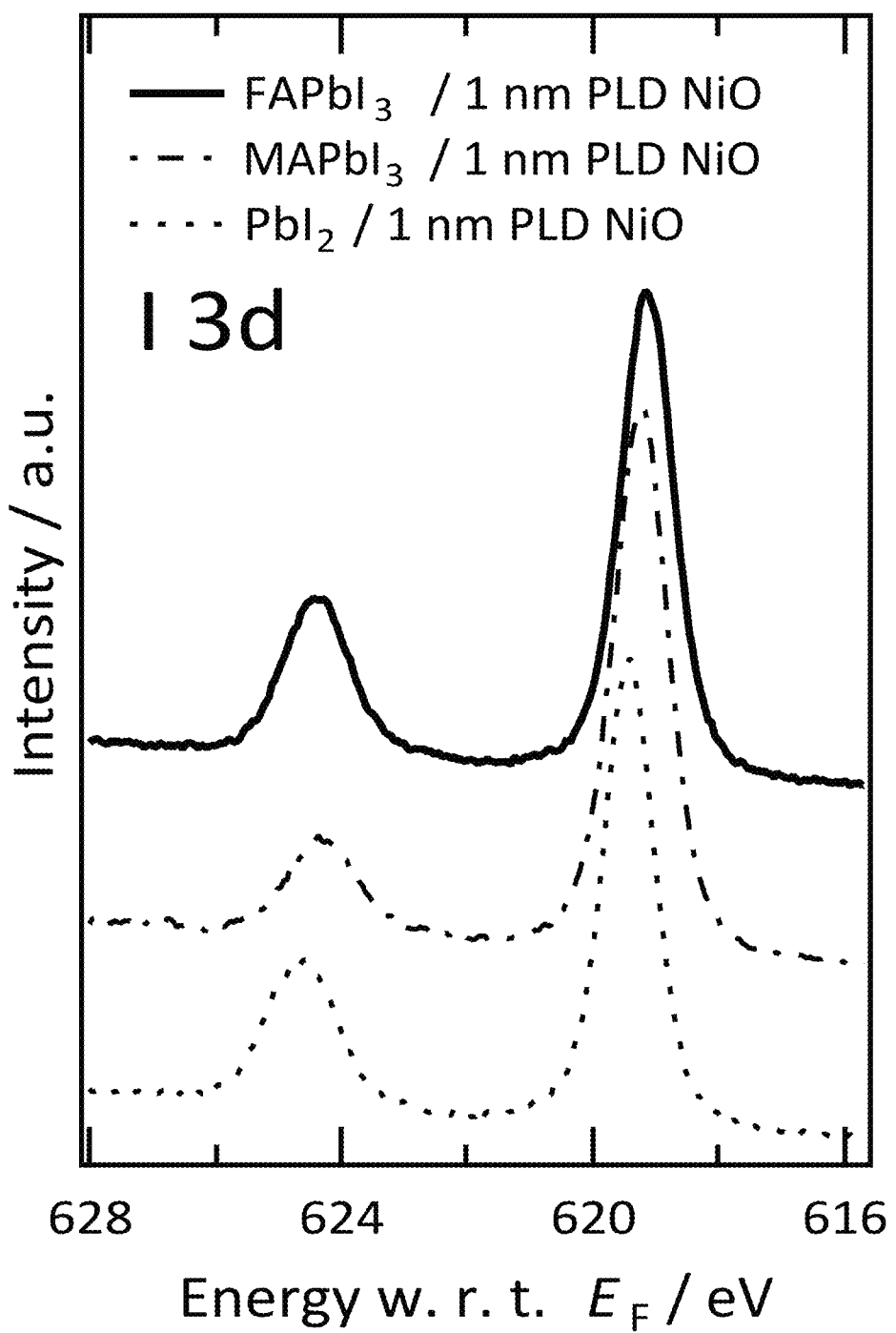
FIGS. 10A, 10B, and 10C illustrate XPS spectra of the I 3d core level region of 1 nm of (FIG. 10A) PLD-NiO and (FIG. 10B) ALD-TiO films on FAPbI$_3$, MAPbI$_3$ and PbI$_2$ as well as XPS spectra (FIG. 10C) of 1 nm PLD-ZnO and PLD-MnO on top of FAPbI$_3$, according to some embodiments of the present disclosure.

For a second oxide thickness of 16 nm, the oxygen peak in XPS was representative of bare NiO. With the formation of the oxy-iodo components all core levels, including the C 1s and N 1s (see FIGS. 8A, 8B, and 8C) related to the plain perovskite layer were shifted by about 0.5 eV to lower binding energies as a clear indication of the formerly n-type $FAPbI_3$ perovskite layer becoming intrinsic or slightly p-type with the formation of the second oxide layer in contact with the perovskite layer. It should be noted that the trends in the UPS spectra (FIG. 7A and FIG. 9) alone are not a direct measures of the Fermi level position in the intact perovskite layer for two reasons. First, the smaller escape depth of electrons in UPS compared to XPS. As a consequence the UPS valence band spectra are mostly dominated by features stemming from the newly formed oxy-iodos at the interface between the perovskite layer and the second oxide layer. Second, the valence band spectra do not exhibit a clear distinction of elemental species and therefore do not yield further information to differentiate between the perovskite layer, the oxy-iodo interlayer or the oxide overlayer (e.g., the oxy-iodo or oxygen-halide complexes that may form between the PAL and the CMT layers). The observed changes in chemical state and electronic structure of the perovskite layer upon PLD-deposition of the second oxide layer are not exclusively linked to the $FAPbI_3$ materials but become apparent for $MAPbI_3$ and even $PbI_2$ alike (see FIG. 10A). A summary of this interfacial alignment between the $FAPbI_3$ PAL and the PLD-NiO CTM is depicted in form of an energy diagram in FIG. 7G, where essentially slight band bending is observed in the growing NiO second oxide layer, which becomes more p-type the further the NiO material is from the interface between the perovskite layer and second oxide layer.

Figure 7E:
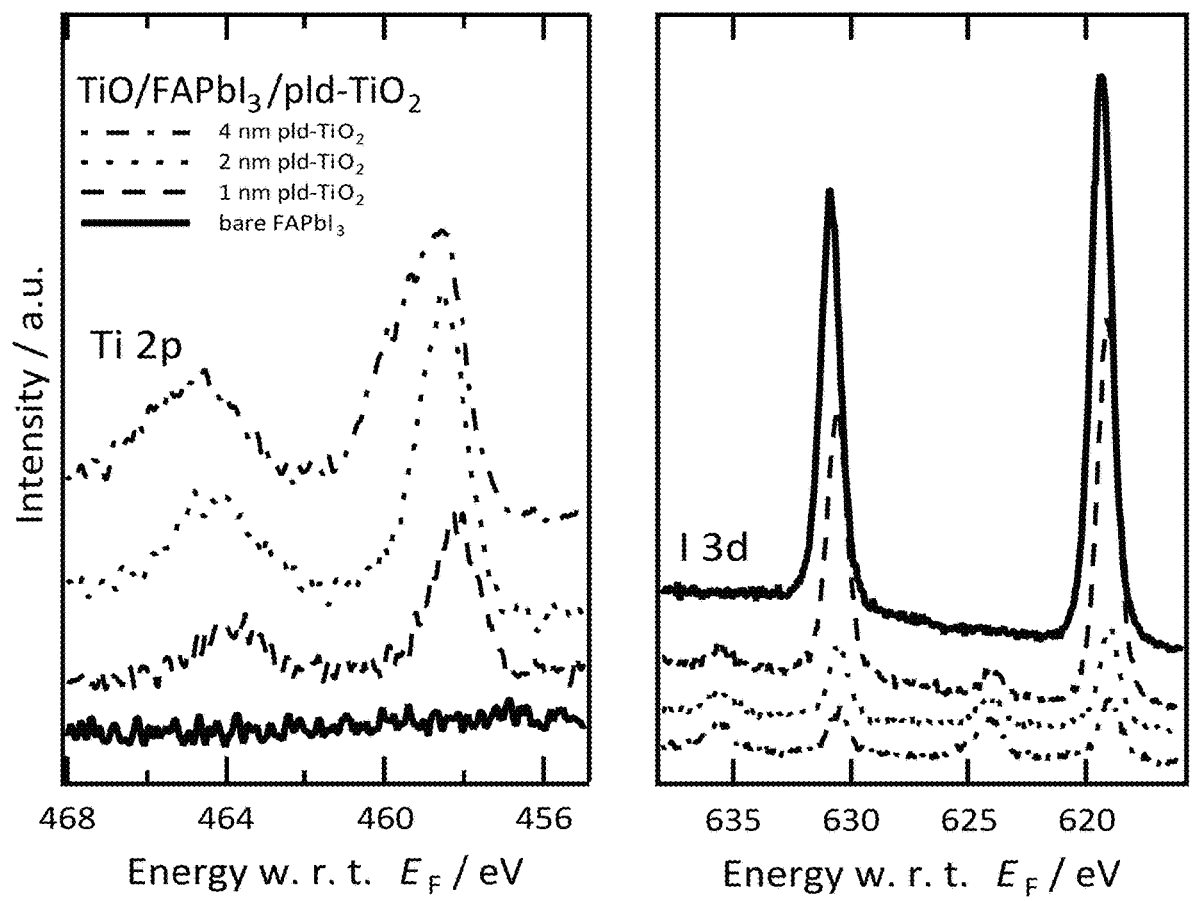
Figure 7F:
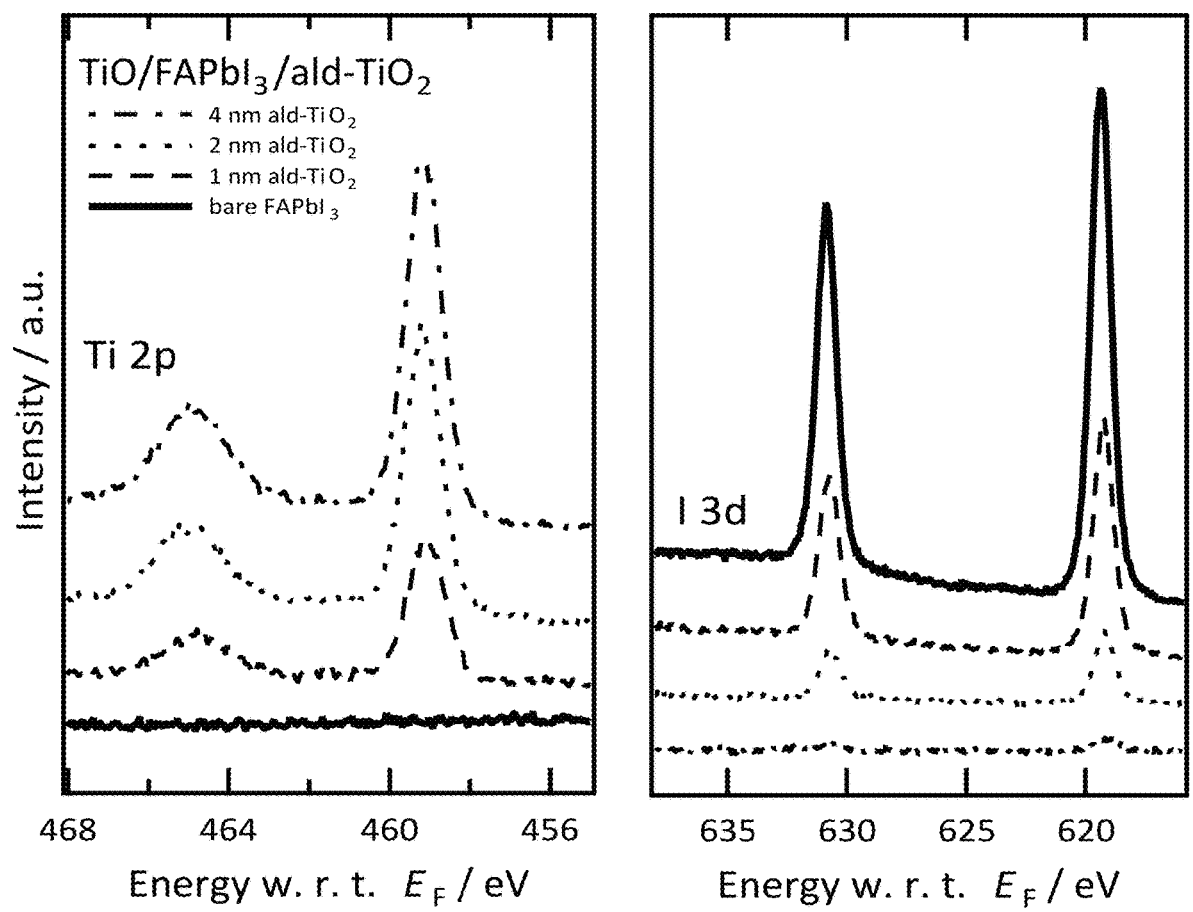
Figure 7H:
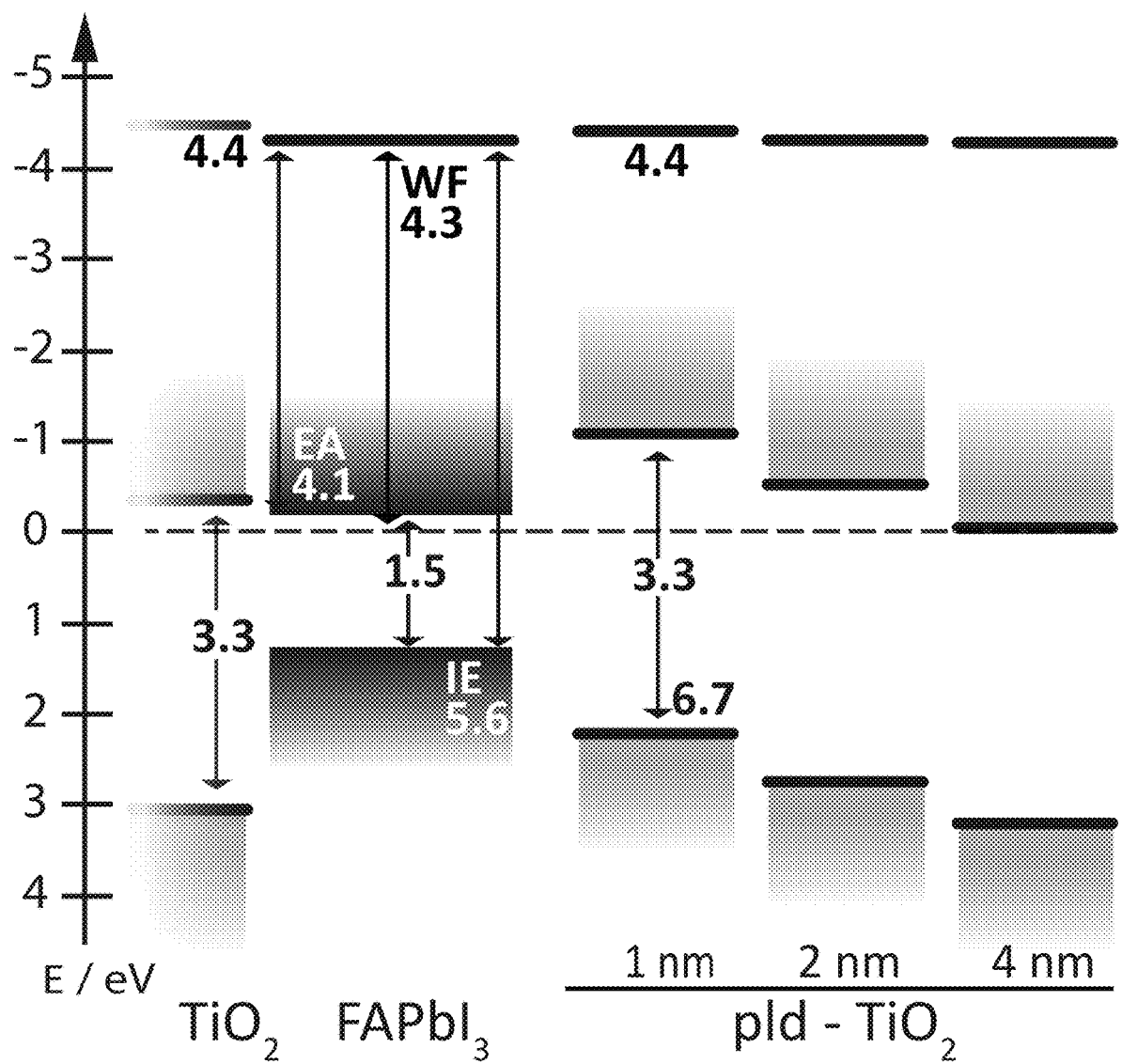

A comparable set of results was found for PLD-deposited $TiO_2$ second oxide layers of 1 nm, 2 nm, and 4 nm thicknesses grown on $FAPbI_3$ perovskite layers, as depicted in FIGS. 7B, 7E, and 7H. For the PLD-deposited $TiO_2$ second oxide layers, a similar interfacial energy level alignment with the perovskite layer was seen when compared to the alignment between PLD-deposited NiO second layers and $FAPbI_3$ perovskite layers. For example, the PLD-deposited $TiO_2$ second oxide layer with a thickness of 1 nm exhibited a work function of 4.4 eV, which again indicates the absence of an interface dipole beyond the margin of error of the measurement. However, the PLD-deposited $TiO_2$ second oxide layer was less n-type than comparable layers deposited on top of conductive oxide surfaces. Similar to the PLD-deposited NiO second oxide layers deposited on $FAPbI_3$ perovskite layers, the PLD-deposited $TiO_2$ second oxide layers showed band bending of comparable magnitude yet of opposite sign. With increasing thickness of the PLD-deposited TiO$_2$ second oxide layers, the VBM was shifted to higher binding energies while at the same time the Ti 2p core level signal was broadened with an additional component at higher binding energies. In summary, the PLD-deposited TiO$_2$ second oxide layers, in the role of a CTM, started rather intrinsic at the interface to the perovskite active layer and then assumed n-doped characteristics farther from the interface between the perovskite layer and the beginning of the second oxide layer. Most importantly the iodine core level region in the XPS scans presented in FIG. 7E matches the changes observed for the PLD-deposited NiO second oxide layer positioned on the FAPbI$_3$ perovskite layer. The FAPbI$_3$ layer became intrinsic at the interface upon the formation of oxy-iodo species yielding the signature I 3d core level lines at 625 eV and 640 eV binding energy.

Figure 7I:
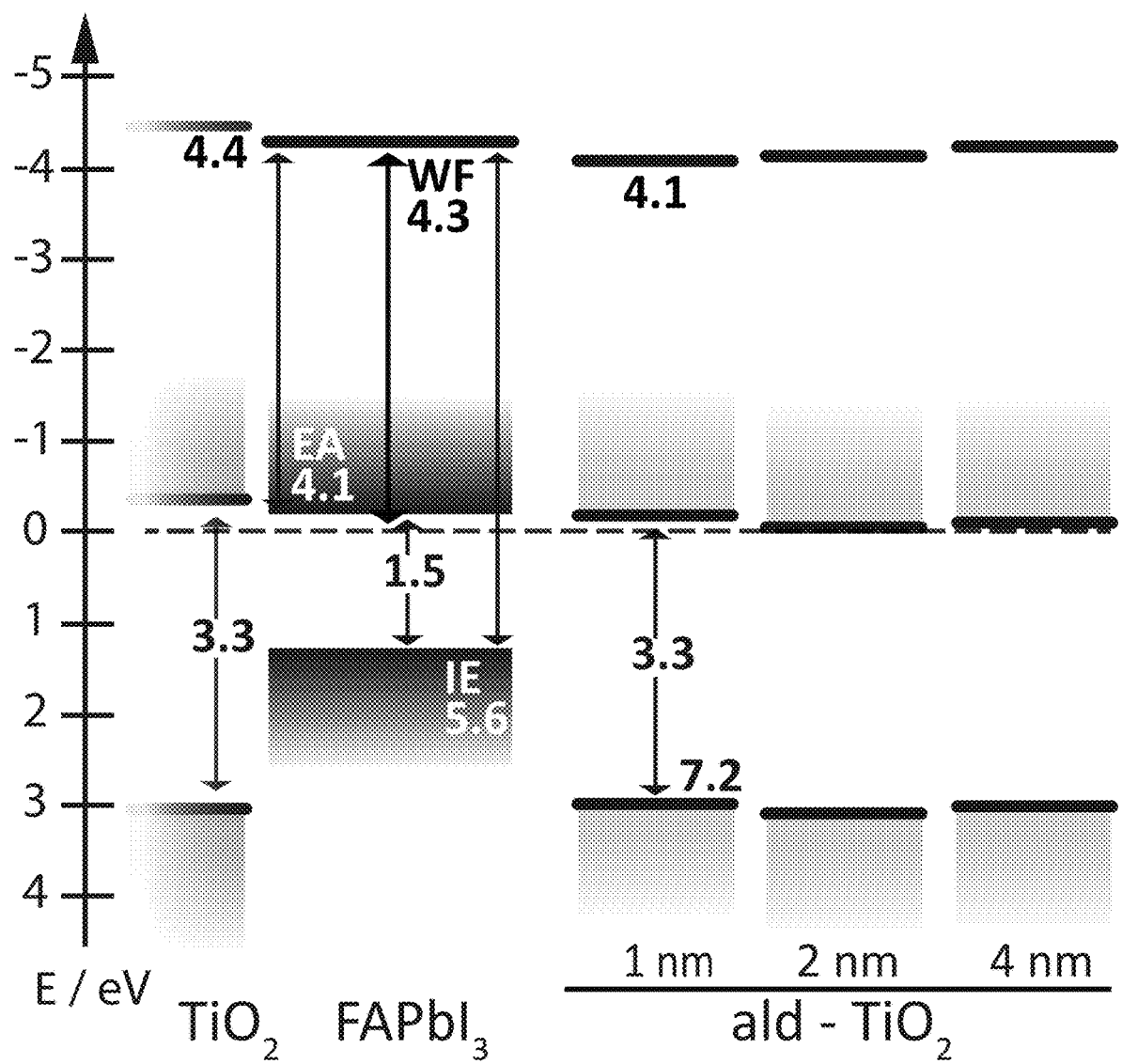
Figure 10B:
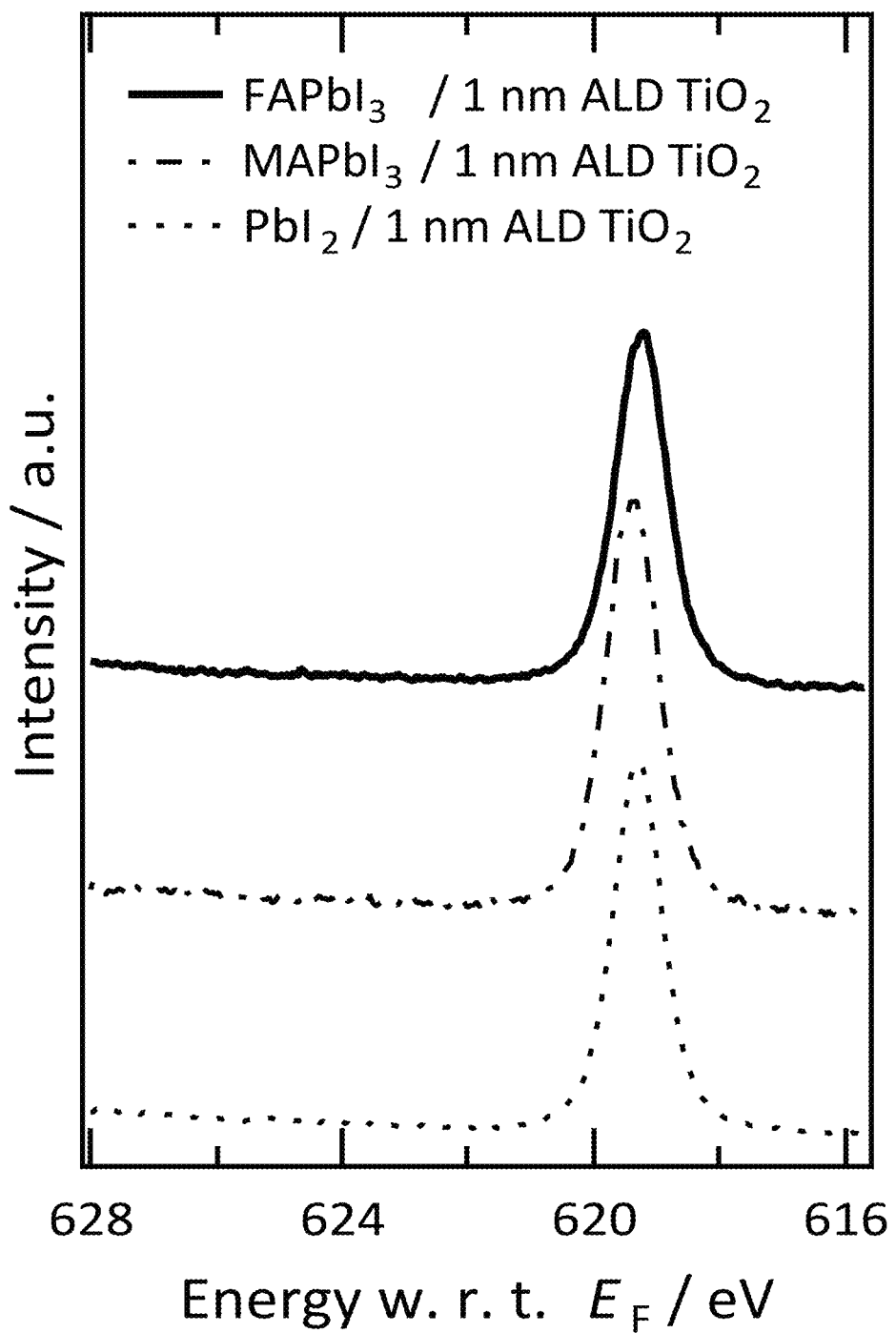
Figure 10C:
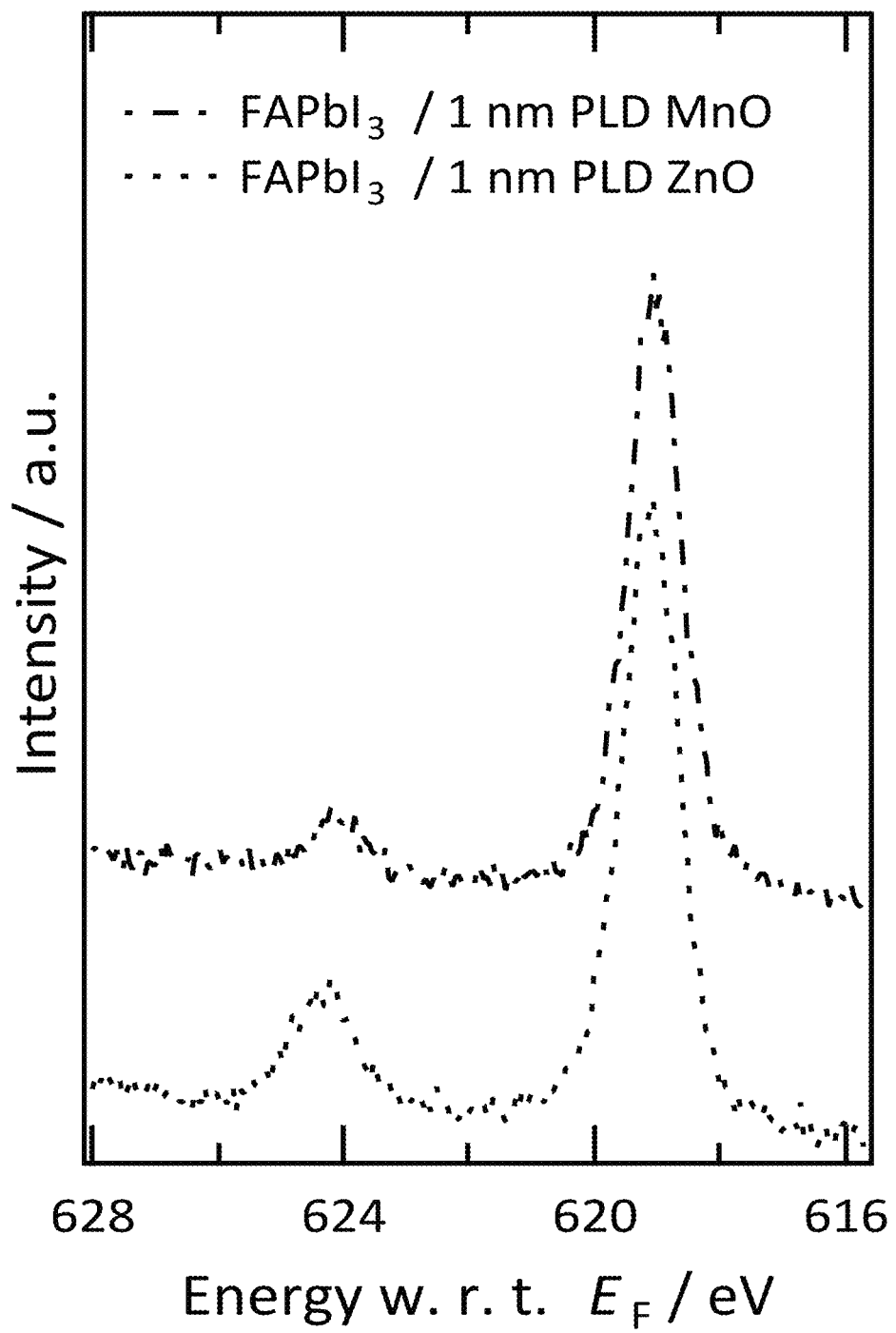

The formation of oxy-iodos in the topmost FAPbI$_3$ perovskite layers was further observed for other PLD-deposited second oxide layers, such as ZnO and MnO (see FIG. 10C) and can thus be attributed universal to this processing technique. The concurring de-doping of the perovskite layer, presumably confined to the interface region, along with the de-doping of the CTM layers (second oxide layers) in the interface region is consistent with the reduced collection of photogenerated charge carriers and the respective surface recombination rates. The PES results for the PLD-deposited second oxide layer CTMs also clearly indicate the importance of the interface construction process methodology and motivate the construction of a PAL/oxide interface without the coincidental formation of an oxy-iodo interlayer. The UPS spectra for the FAPbI$_3$ samples on TiO$_2$ (first oxide layer)/FTO/glass substrates with ALD-deposited TiO$_2$ second oxide layers on top of the FAPbI$_3$ perovskite layer at respective nominal film thicknesses of 1 nm, 2 nm, and 4 nm are depicted in FIG. 7C. It is noteworthy that the shift in EF throughout the ALD-deposited TiO$_2$ second oxide layer was fairly small relative to the PLD-deposited second oxide layers. With the initial deposition of a 1 nm thick ALD-deposited TiO$_2$ second oxide layer, the work function dropped from 4.3 eV for the pure FAPbI$_3$ surface down to 4.1 eV. Increasing the thickness of the ALD-deposited TiO$_2$ second oxide layer led to a relaxation of the vacuum level position back to 4.3 eV. The valence band maximum of the ALD-deposited TiO$_2$ second oxide layer was located at 3.2 eV below EF for the 1 nm thick second oxide layer positioned on the FAPbI$_3$ perovskite layer. This indicates that the ALD-deposited TiO$_2$ second oxide layer (bandgap approximately 3.3 eV) was strongly n-doped as expected with the projected conduction band minimum being located at about 0.1 eV above EF. Moving away from the FAPbI$_3$/ALD-deposited TiO$_2$ second oxide interface by increasing the thickness of the ALD-deposited TiO$_2$ second oxide layer revealed that the VBM was shifted to slightly smaller binding energies, which means that the ALD-deposited TiO$_2$ second oxide layer became less n-type further away from the interface. This energetic alignment is summarized in the energy level diagram in FIG. 7I. Consequently, the positions of the Ti (FIG. 7F) and O (see FIGS. 8A, 8B, and 8C) core levels in the XPS spectra are consistent with the shifts observed in UPS within the experimental resolution.

Furthermore, the XPS spectra reveal the evolution of the perovskite layer covered with the thin ALD-deposited TiO$_2$ second oxide layers. Most striking is the absence of the additional doublet peaks for the I 3d core level spectra at 625 and 640 eV binding energies previously observed in PLD films. This evidence shows that no IO$_3$ species formed between the perovskite layer and the ALD-deposited TiO$_2$ second oxide layer. In contrast to the case where oxy-iodo species were present at the interface or on top of the perovskite layer as a result of ozone treatment, no peak shifts were observed in the core levels indicating a consistent Fermi level position. Thus, the perovskite films remained n-type below coating of the ALD-deposited TiO$_2$ second oxide layer. From the spectroscopic data, one can conclude that by decoupling the oxide/PAL interface from the formation of oxy-iodo species, band bending induced in the perovskite films, when PLD-TiO$_2$ films are grown on top of the PAL, and that the process is indeed caused by the presence of an IO$_3$ layer which destroys device performance. In contrast, the adjacent ALD-deposited TiO$_2$ second oxide layer alone, without IO$_3$, seemingly did not change the electronic properties of the underlying FAPbI$_3$ perovskite layer or destroy the device performance. The absence of oxy-iodo formation upon ALD-TiO$_2$ deposition was not confined to the FAPbI$_3$ perovskite layer example, but also held true for devices having ALD-deposited TiO$_2$ second oxide layers deposited on top of MAPbI$_3$ as well as on PbI$_2$ (see FIG. 10B).

Figure 11A:
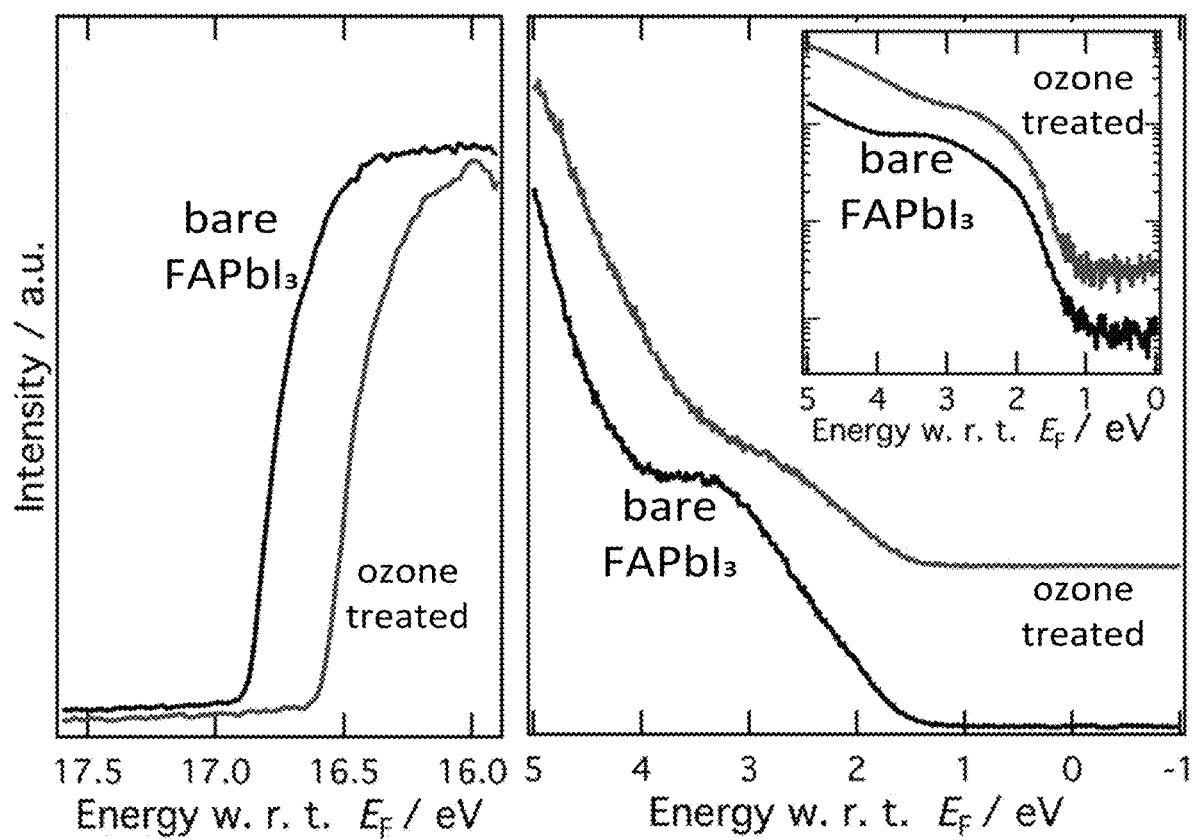
FIG. 11A illustrates UPS spectra of ozone treated FAPbI$_3$ films on TiO$_2$.
Figure 11B:
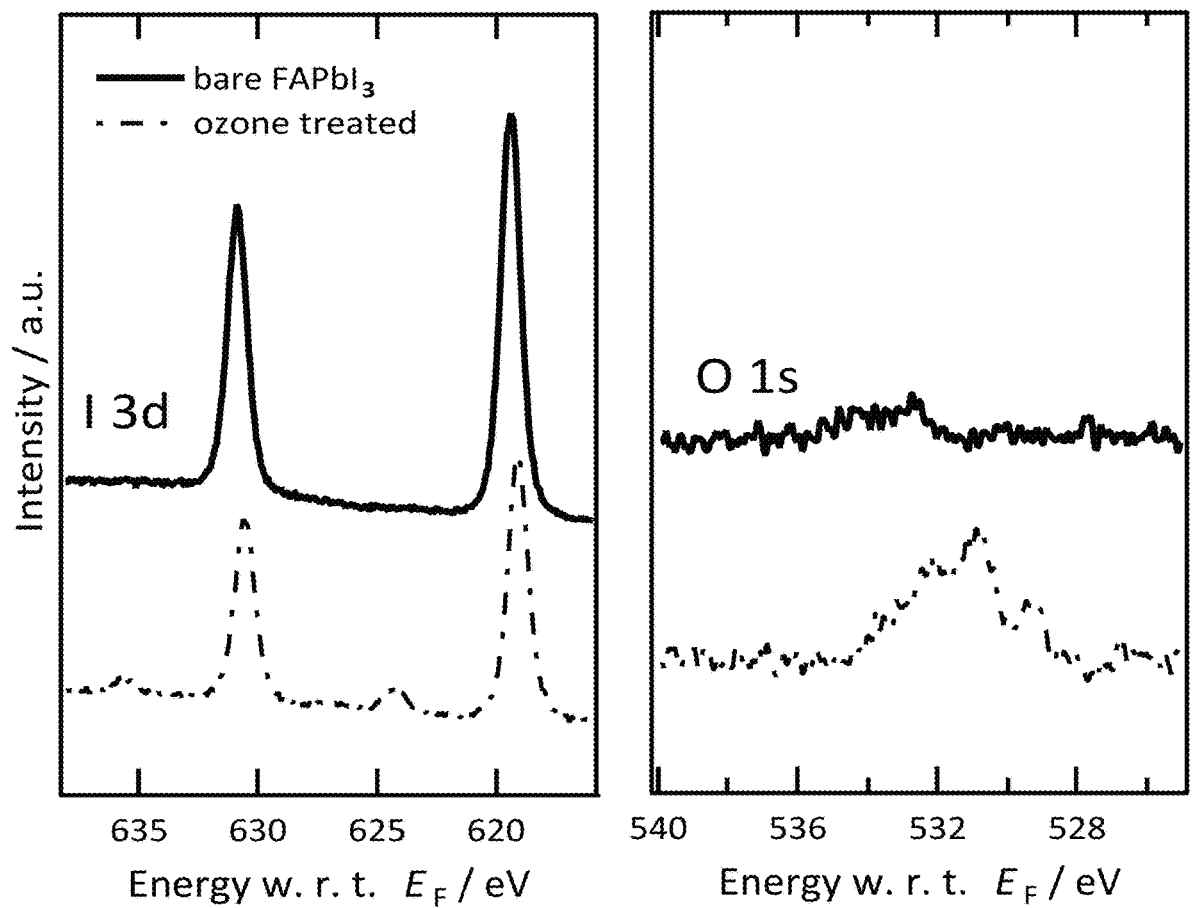
FIG. 11B illustrates XPS spectra of ozone treated FAPbI$_3$ films on TiO$_2$.
Figure 11C:
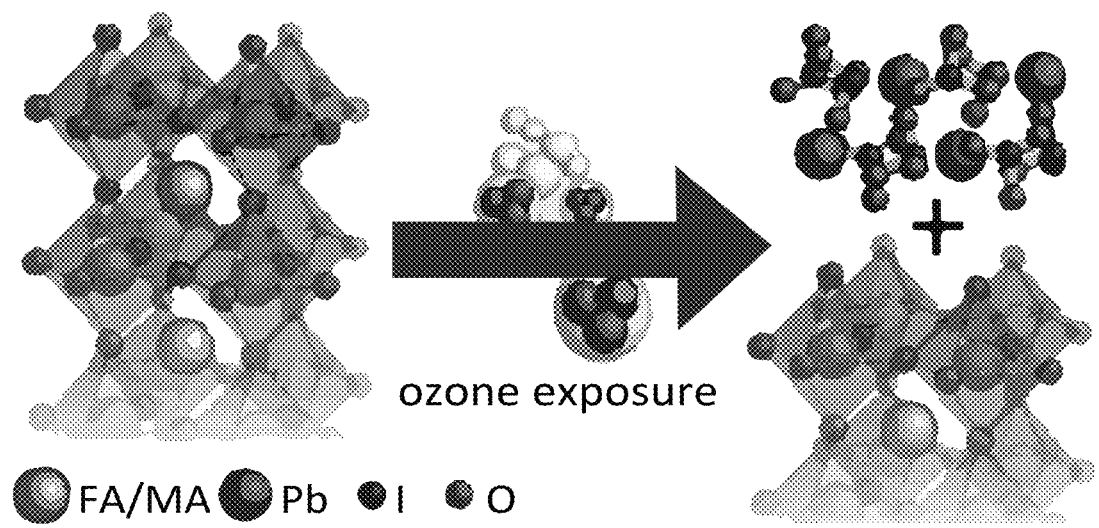
FIG. 11C illustrates a formation mechanism formation schematic, according to some embodiments of the present disclosure.
Figure 12A:
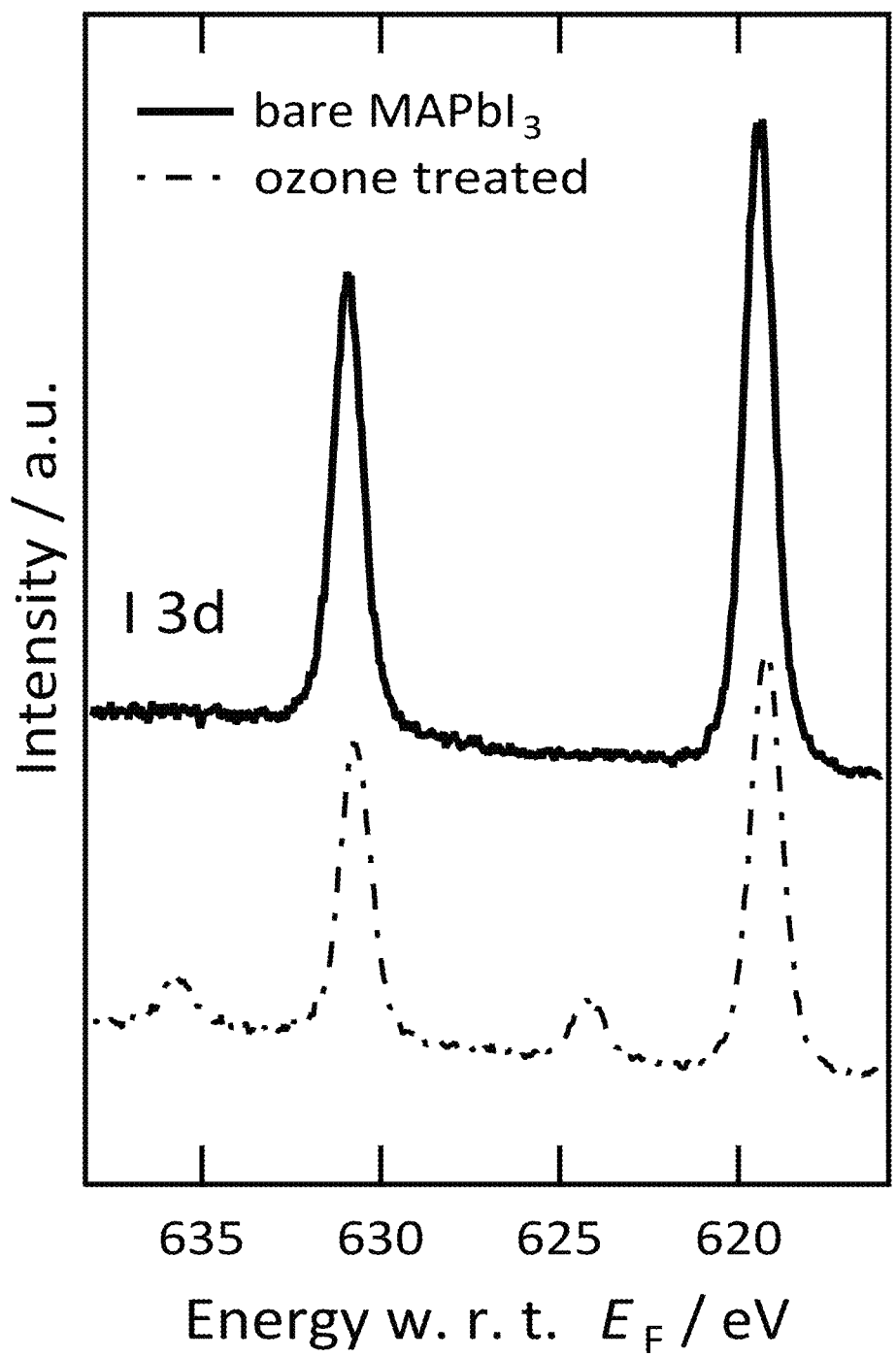
FIG. 12A illustrates XPS spectra of the I 3d region for plain MAPbI$_3$ and ozone treated MAPbI$_3$ thin-films on TiO$_2$.
Figure 12B:
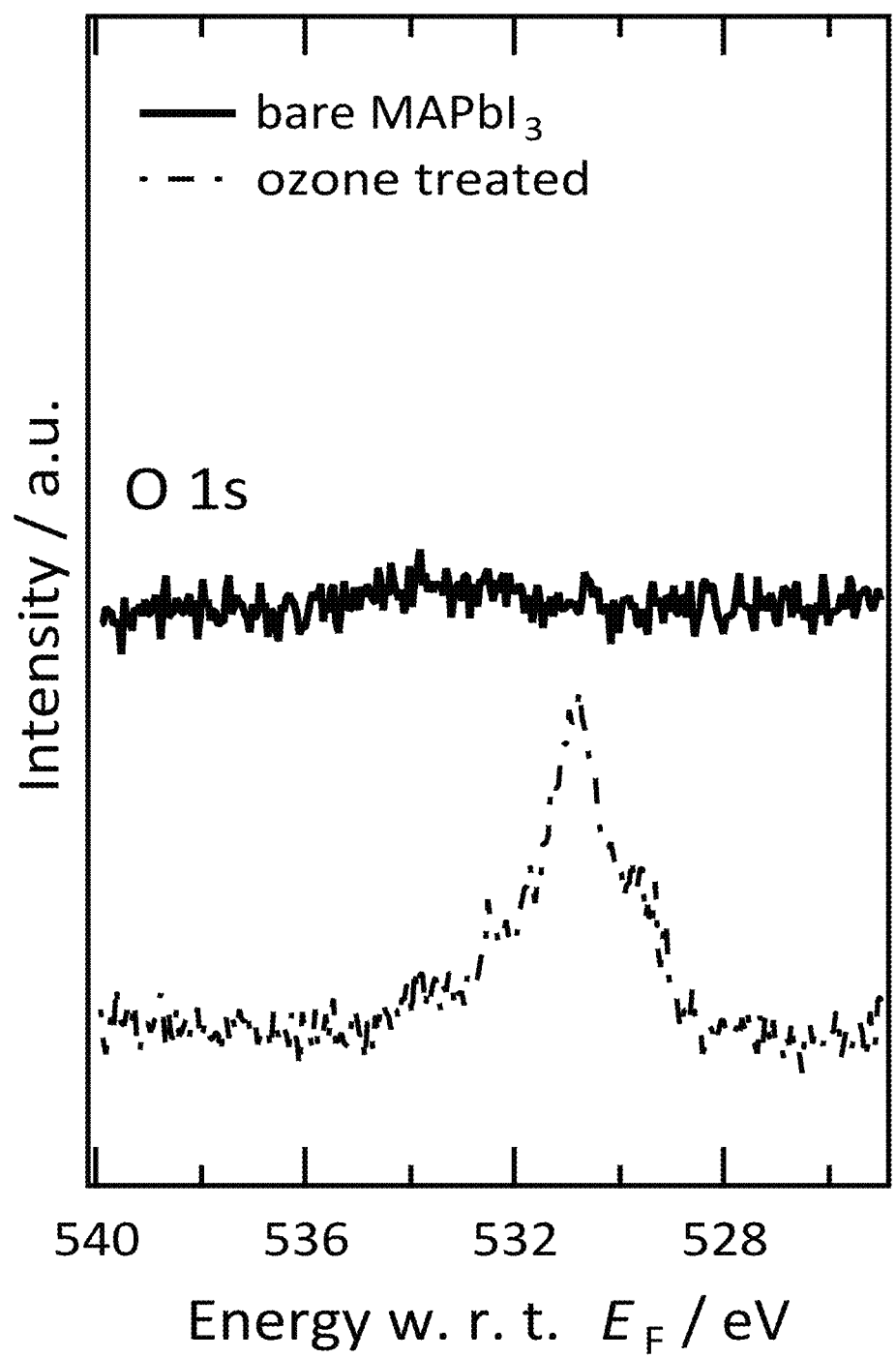
FIG. 12B illustrates XPS spectra of the O 1s region for plain MAPbI$_3$ and ozone treated MAPbI$_3$ thin-films on TiO$_2$.
Figure 13A:
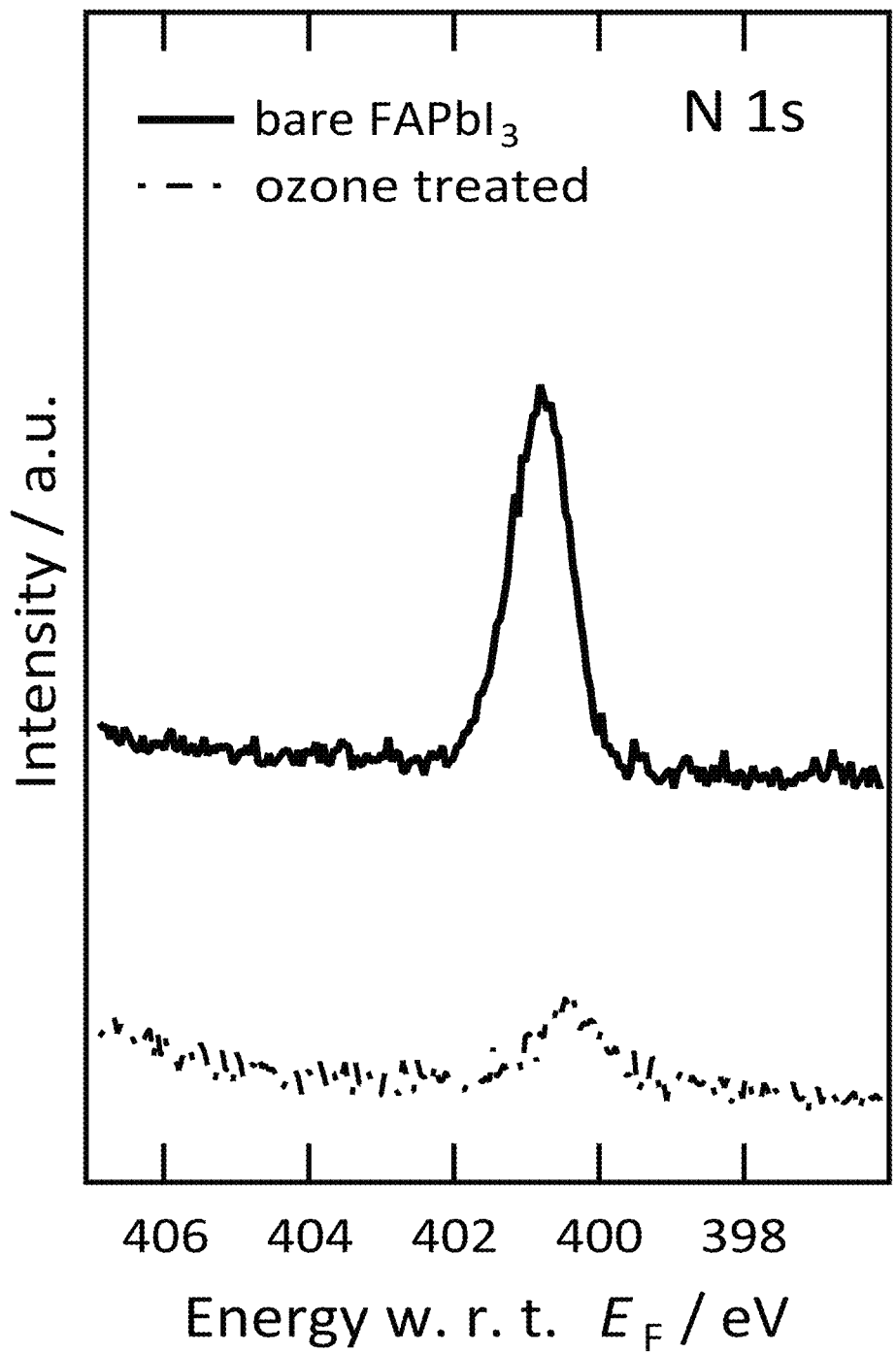
FIG. 13A illustrates XPS spectra of the N 1s core level region for ozone treated FAPbI$_3$, according to some embodiments of the present disclosure.
Figure 13B:
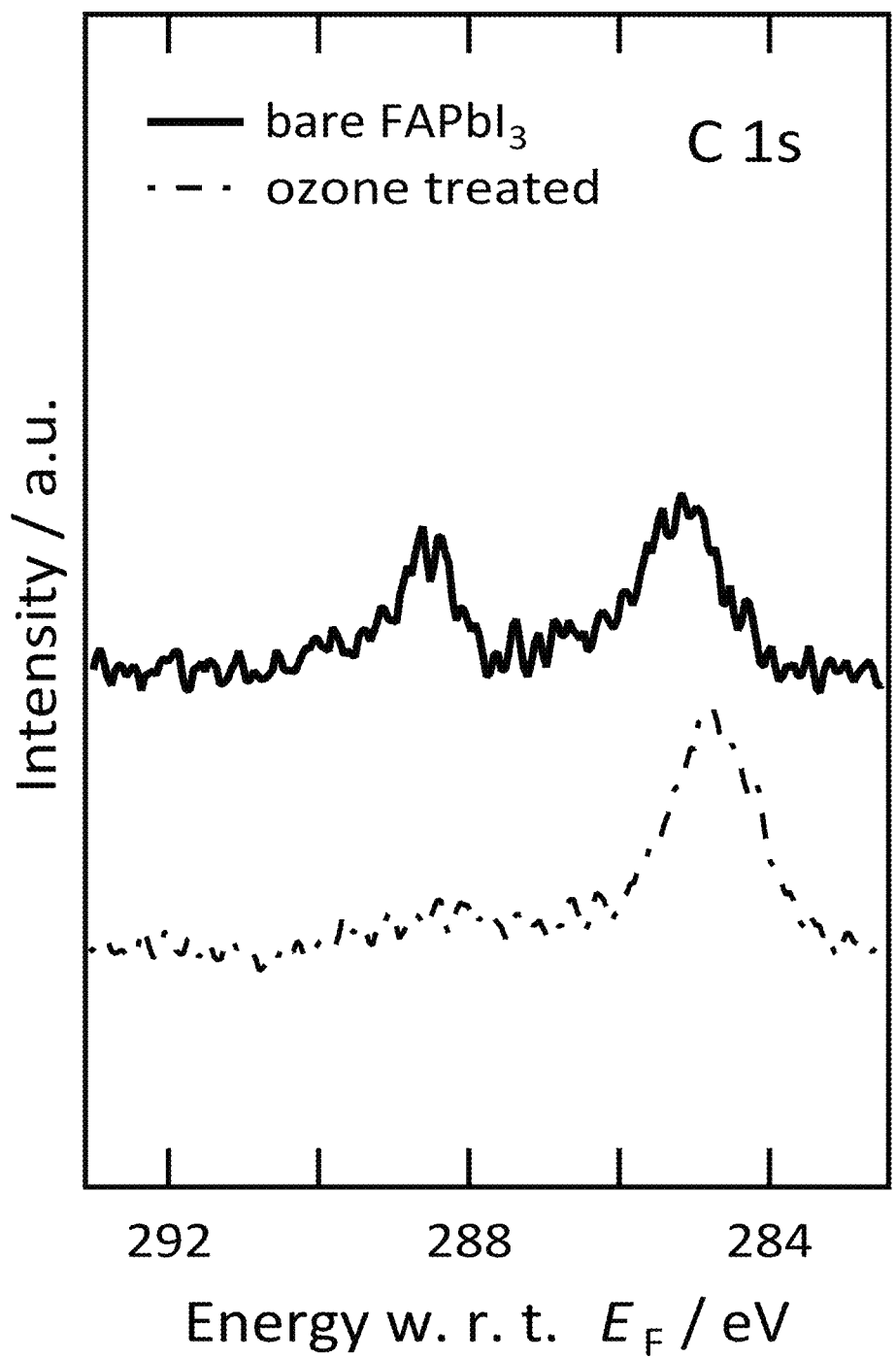
FIG. 13B illustrates XPS spectra of the C 1s core level region for ozone treated FAPbI$_3$, according to some embodiments of the present disclosure.
Figure 13C:
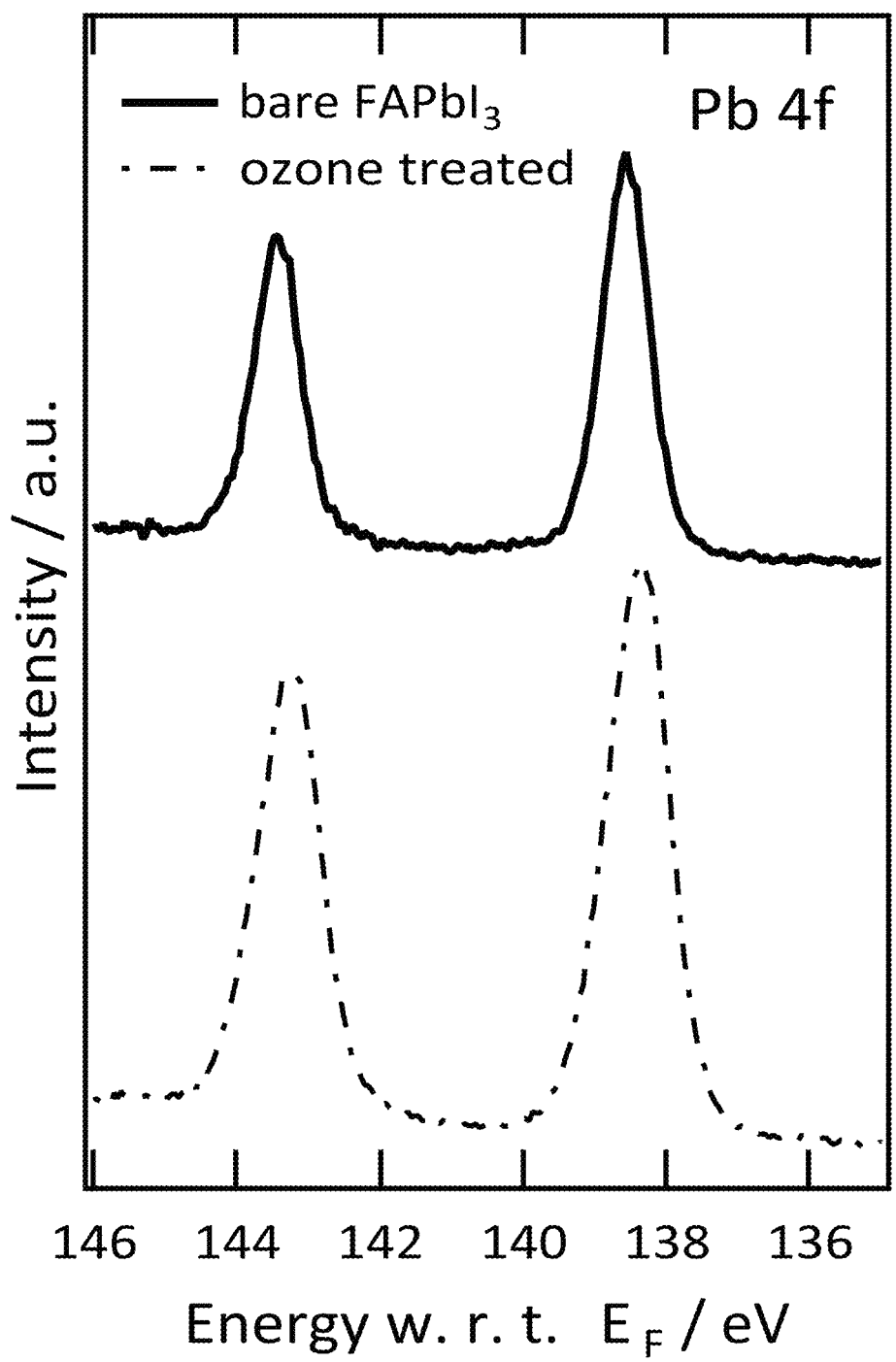
FIG. 13C illustrates XPS spectra of the 4f core level region for ozone treated FAPbI$_3$, according to some embodiments of the present disclosure.

Based on the combination of PES and time resolved photoluminescence (TRPL) clear evidence is provided herein for the deleterious impact of oxy-iodo complex, and potentially for other oxy-halogen complexes, at perovskite active layer/charge transport interfaces. In addition, these defects appear to result in a depletion of electrons in the perovskite layer, transforming it into an intrinsic material with a Fermi level in the middle of the electronic band gap. This result indicates exposure to any oxygen radicals may elicit this response from perovskite active materials. To validate this the impact of exposure of the hybrid perovskite films to ozone on the respective surface stoichiometry and electronic properties was examined, determined again by photoemission spectroscopy as depicted in FIGS. 11A and 11B. First and foremost, an increase in the work function from 4.3 eV to 4.7 eV was seen in the secondary electron cut-off in the UPS spectra as seen in FIG. 11A. At the same time the valence band features of the FAPbI$_3$ layer broadened and became less well defined as a result of the ozone treatment. Again, the precense of oxy-iodo species was observed, as indicated by the additional I 3d doublet in the XPS spectra in FIG. 11B similar to the case of PLD-deposited second oxide layers positioned on top of the perovskite layers, while the presence of oxygen became apparent from the O 1s region in the XPS spectra depicted in FIG. 11B. Similar to the case of the PLD-deposited second oxide layers, the main I 3d peaks were shifted by 0.4 eV towards lower binding energies, mirroring the change in work function measured by UPS. Evidence for the formation of oxy-iodos is also found for ozone treated MAPbI$_3$ perovskite layers (see FIGS. 12A and 12B), which indicates that this reaction is universal for a range of perovskite active layers analogously to the oxy-iodo formation during the PLD-deposition of second oxide layers (e.g. NiO) onto the underlying perovskite active layers. Furthermore, a significant loss of nitrogen and carbon was observed (see FIGS. 13A, 13B, and 13C) which translated into a deficiency of the organic component formamidinium as a result of the ozone treatment.

In conclusion, several important aspects related to HPSCs are presented herein. First, the details of interfacial chemistry between a perovskite active layer and an oxide (e.g. a charge transport layer) can dominate the electronics at this junction depending on the process conditions as demonstrated by the TRPL and device studies in which we are able to make a functional device with symmetric CTM materials. Second, by examining the interface with PES, a complex reaction mechanism was identified, and its impact on the charge transfer between hybrid perovskite layers and oxide layers (e.g. transition metal oxides) deposited on the perovskite layers was illucidated. For at least the examples described herein, of PLD-deposited oxide layers, a chemical reaction takes place, which results in oxy-iodo species forming between the perovskite layer and the resultant oxide layer (e.g. CTM). This oxy-iodo layer led to p-doping of the perovskite layer. Dedicated growth of a similar $IO_3$ layer was achieved by ozone treatment of the perovskite layer, identifying reactive oxygen as the source for the chemical reaction. Subsequently it was demonstrated that alternative, ozone-free deposition methods (e.g., ALD, neutralized sputtering, or other methods that preclude oxygen radicals) can be used to produce thin oxide layers on contact with perovskite active layers, without the formation of $IO_3$ in between. The oxy-iodo interlayers at hybrid perovskite interfaces impede charge transfer between the perovskite layer and their neighboring charge transport layers (e.g. oxide layers and/or organic layers), dramatically reducing device performance. Inhibiting the formation of oxy-iodos at the critical PAL/CTM interface, however, enables the integration of oxide layers into hybrid perovskite based electronics, while retaining the tunability of contacts and their charge extraction capabilities. These considerations become of uttermost importance when integrating hybrid perovskite active layers in device geometries with ever increasing complexity in composition and layout. Thus, shielding the perovskite active layer from environmental ozone and oxygen radicals is perhaps a critical component in increasing film and hence device stability.

Methods

Perovskite layer preparation: Fluorine-doped tin oxide (FTO, TEC15, Hartford, Ind.) was cleaned by an overnight base bath soaking (5 wt % NaOH in ethanol). A compact $TiO_2$ layer (first oxide layer) was deposited by spray pyrolysis of 0.2 M titanium diisopropoxide bis(acetylacetonate) in 1-butanol solution at 450° C. Therein the precursor was made of 44 wt % of 1:1 molar ratio of MAI and $PbI_2$ in γ-Butyrolactone (GBL, Aldrich)/dimethyl sulfoxide (DMSO, Sigma-Aldrich) (7/3 v/v). The substrates were span at 4500 rpm for 50 s with a drop of toluene being casted during the spinning. The perovskite layer was fully crystallized by annealing at 85° C. for 10 min.

Pulsed laser deposition: The PLD-deposited second oxide layers were produced via ablation of solid oxide targets in an $Ar/O_2$ atmosphere using a light beam from a KrF laser (operating at 248 nm with a pulse duration of 25 ns, at a laser density of 2 $J/cm^2$, and at a repetition rate of 10 Hz. Film thicknesses were measured by profilometry, and ellipsometry. The atmosphere of the deposition chamber was set after establishing deposition conditions in which the electronic properties (i.e. work function) of the resulting oxide were in a regime favorable for hole extraction from the PAL and to avoid production of metallic components Atomic layer deposition: ALD-deposited $TiO_2$ second oxide layers were realized by reacting $TiCl_4$ with $H_2O$ to form $TiO_2$ layers. Alternatively, titanium isopropoxide or tetrakis(dimethylamino)titanium can be used as pre-cursors for the ALD process. Water was used as oxidizing agent to react the precursor to a solid $TiO_2$ film. In a similar approach $O_2$ can be used as oxidizing agent as well. The deposition temperatures were in the range of 50° C. Depending on the temperature resilience of the underlying perovskite films, reaction temperatures of up to 300° C. can be employed to deposit ALD thin films as oxy-iodo free interlayers. The thickness range can be deposited from "1/2 of a cycle" type layer, corresponding to just a singular $TiCl_4$ exposure, all the way to several 100 nm. Herein, a total cycle time of about 10 seconds with 250 ms dose and 5 seconds purge were used.

Photoemission spectroscopy: Photoemission Spectroscopy measurements were performed on a Kratos NOVA spectrometer calibrated to the Fermi edge and core level positions of sputter-cleaned metal (Au, Ag, Cu, Mo) surfaces. Ultraviolet photoemission spectra were acquired from the He I (21.22 eV) excitation line at a nominal experimental resolution below 150 meV. X-ray photoemission spectra were taken using monochromated Al Kα radiation (1486.7 eV) at a resolution of 400 meV (pass energy 10 eV, step size 0.025 eV, dwell time 120 ms). XPS spectra were fit using Pseudo-Voigt profiles. The acquired spectra were all referenced to the previously determined Fermi level of the sputter-cleaned metal calibration samples.

Time resolved photoluminescence: TRPL decay curves were taken on a time correlated single photon counting system, where the light source is a Fianium Supercontinuum high power broadband fiber laser (SC400-2-PP). The excitation light has a power of ~25 μW on a spot size of 0.02 $mm^2$. The decay curve was fitted using a single exponential model.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising, in order:
  a first oxide layer comprising $TiO_2$;
  a perovskite layer comprising a halogen;
  a second oxide layer comprising $TiO_2$ and having a first surface and a second surface defining a thickness between the first surface and the second surface; and
  a hole transport layer, wherein:
  the thickness is between 1 nm and 16 nm,
  the first oxide layer is n-type,
  the first surface is in physical contact with the perovskite layer, resulting in an interface between the perovskite layer and the first surface,
  the interface is substantially free of an oxygen species comprising the halogen, the second surface is in physical contact with the hole transport layer, the second oxide layer is n type at the interface, and the second oxide layer is less n-type at the second surface than at the interface.

2. The device of claim 1, wherein the second oxide layer is free of an oxy-halogen species.

3. The device of claim 1, further comprising a substrate, wherein the first oxide layer is positioned between the perovskite layer and the substrate.

4. The device of claim 1, wherein the perovskite layer comprises at least one methyl ammonium lead iodide or formamidinium lead iodide.

5. The device of claim 1, wherein the first oxide layer comprises a transparent conducting oxide.

6. The device of claim 5, wherein the transparent conducting oxide comprises fluorine-doped tin oxide.

7. The device of claim 1, wherein the hole transport layer comprises spiro-OMeTAD.

8. The device of claim 2, wherein the oxy-halogen species comprises an oxy-iodo species.

9. The device of claim 1, wherein the interface is free of any oxy-halogen species.

10. The device of claim 1, wherein the second oxide layer is deposited by atomic layer deposition in the absence of oxygen.

* * * * *